US012797962B2

(12) United States Patent
Tanaka et al.

(10) Patent No.: US 12,797,962 B2
(45) Date of Patent: Nov. 17, 2026

(54) COATED CUTTING TOOL

(71) Applicant: TUNGALOY CORPORATION, Fukushima (JP)

(72) Inventors: Shigeki Tanaka, Iwaki (JP); Kiyofumi Nemoto, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 280 days.

(21) Appl. No.: 18/882,042

(22) Filed: Sep. 11, 2024

(65) Prior Publication Data

US 2025/0091135 A1 Mar. 20, 2025

(30) Foreign Application Priority Data

Sep. 20, 2023 (JP) ................................. 2023-152311

(51) Int. Cl.

| | |
|---|---|
| ***B23B 27/14*** | (2006.01) |
| ***C23C 14/06*** | (2006.01) |
| ***C23C 28/00*** | (2006.01) |
| *C04B 41/50* | (2006.01) |

(52) U.S. Cl.

CPC ........ *B23B 27/148* (2013.01); *C23C 14/0641* (2013.01); *C23C 28/44* (2013.01); *B23B 2224/24* (2013.01); *B23B 2228/08* (2013.01); *B23B 2228/105* (2013.01); *B23B 2228/36* (2013.01); *C04B 41/5063* (2013.01); *C04B 41/5064* (2013.01); *C04B 41/5068* (2013.01)

(58) Field of Classification Search

CPC .............. B23B 27/148; B23B 2224/24; B23B 2228/08; B23B 2228/105; B23B 2228/36; C23C 14/0641; C23C 28/44; C04B 41/5063; C04B 41/5064; C04B 41/5068

See application file for complete search history.

(56) References Cited

U.S. PATENT DOCUMENTS

| | | | | |
|---|---|---|---|---|
| 2013/0108850 | A1* | 5/2013 | Kudo | C04B 35/5831 428/216 |
| 2018/0209031 | A1 | 7/2018 | Gothelid et al. | |
| 2024/0123515 | A1 | 4/2024 | Asanuma et al. | |

FOREIGN PATENT DOCUMENTS

| | | | | |
|---|---|---|---|---|
| EP | 3929328 | A1 * | 12/2021 | C23C 28/42 |
| WO | 2017/009101 | A1 | 1/2017 | |
| WO | 2022/176230 | A1 | 8/2022 | |

* cited by examiner

*Primary Examiner* — Blaine Copenheaver
(74) *Attorney, Agent, or Firm* — Studebaker Brackett PLLC

(57) ABSTRACT

A coated cutting tool including a substrate and a coating layer formed on the substrate, wherein the coating layer has a first alternately laminated structure in which two or more A layers and two or more B layers are alternately formed, the A layer contains $(Al_aCr_bTi_{1-a-b})N$, the B layer contains $(Al_cTi_{1-c-d}B_d)N$, the average thickness of the first alternately laminated structure is 0.50 μm or more and 10.00 μm or less, and the average thickness per layer of each of the A layer and the B layer in the first alternately laminated structure is 2 nm or more and 300 nm or less.

20 Claims, 2 Drawing Sheets

COATED CUTTING TOOL

BACKGROUND OF THE INVENTION

Field of the Invention

The present invention relates to a coated cutting tool.

Description of Related Art

In the related art, cutting tools made of cemented carbide or cubic boron nitride (cBN) sintered body have been widely used for cutting of steel or the like. Among them, surface coated cutting tools containing one or two or more hard coating films such as a TiN layer, a TiAlN layer and a TiCrN layer on a surface of a cemented carbide substrate are used for various machining due to high versatility thereof.

For example, WO 2022/176230 suggests a surface coated cutting tool including a tool base and a coating layer, wherein the coating layer has a thickness of 0.2 to 10.0 μm, and contains a structure in which at least one first layer and at least one second layer are alternately laminated; the at least one first layer has an average thickness of 0.5 to 100.0 nm, and has an average composition represented by the formula: $(Al_xTi_{1-x-y-z}M_y)B_zN$ (provided that, M is one or more elements from Group 4, Group 5, Group 6, and lanthanoids of the periodic table, x is 0.100 to 0.640, y is 0.001 to 0.100, and z is 0.060 to 0.400), and the at least one second layer has an average thickness of 0.5 to 100.0 nm, and has an average composition represented by the formula: $(Al_pCr_{1-p-q-r}M'_q)B_rN$ (provided that, M' is one or more elements from Group 4, Group 5, Group 6, and lanthanoids of the periodic table, p is 0.650 to 0.900, q is 0.000 to 0.100, and r is 0.000 to 0.050).

Moreover, for example, WO 2017/009101 suggests a coated cutting tool including a cemented carbide body and a PVD coating, wherein the cemented carbide body has a composition of 5 to 18 wt % Co, 0.1 to 2.5 wt % Cr, 0 to 10 wt % a carbide or a carbonitride of Group 4, 5, and 6 metal of the periodic table of elements (other than WC), and the balance of WC, the PVD coating is a nanolayer PVD coating having an average composition $Ti_aAl_bCr_cN$ (a=0.25 to 0.7, b=0.3 to 0.7, and c=0.01 to 0.2, and a+b+c=1), the PVD coating is a nanolayer PVD coating A/B/A/B/A . . . , wherein the sublayer A is composed of $Ti_uAl_vCr_wN$ (u=0.1 to 0.4, v=0.5 to 0.8, w=0.01 to 0.3, u+v+w=1), and the sublayer B is composed of $Ti_xAl_yCr_zN$ (x=0.4 to 0.7, y=0.3 to 0.6, z=0 to 0.2, x+y+z=1, u<x, and v>y), and the thickness of the nanolayer PVD coating is 0.5 to 10 μm.

SUMMARY

Technical Problem

In recent years, power saving and energy saving, and further, cost reduction are strongly required in cutting, and in response to this, performance capable of withstanding more efficient machining is required for a coated cutting tool. As more efficient machining, for example, cutting conditions tend to be high speed and/or high feed; however, there is a significant difference in the performance required for a coated cutting tool in these conditions.

In high-speed machining, the material used for a coated cutting tool is required to have high hardness to increase wear resistance, have improved thermal shock resistance at high temperatures, and suppress the embrittlement due to the change in the quality of the material. Meanwhile, in high-feed machining, the material used for a coated cutting tool is required to have high toughness because the burden applied to the tool cutting edge is likely to be high.

It is generally difficult to achieve both properties required for coated cutting tools in high-speed machining and high-feed machining, so that a coated cutting tool suitable for each machining is usually selected and used. Meanwhile, achieving and enhancing these two properties are preferable from the viewpoint of cost reduction because a single kind of coated cutting tool can correspond to various machining conditions.

In the surface coated cutting tool of WO 2022/176230, alternate lamination of the first layer that contains the B element and the second layer that may contain no B element is formed in the coating layer, and the thermal shock resistance in high-speed machining is excellent. However, the surface coated cutting tool of WO 2022/176230 has insufficient thermal stability and toughness in the vicinity of the interface between the first layer and the second layer in the coating layer, and has room for further improvement. For the above reason, the surface coated cutting tool of WO 2022/176230 has room for improvement in both the fracture resistance in high-speed machining and the fracture resistance in high-feed machining.

In the coated cutting tool of WO 2017/009101, alternate lamination of the sublayer A and the sublayer B is formed in the coating layer, the fracture resistance in high-feed machining is excellent. Meanwhile, since the hardness of the coating layer is insufficient due to the coating layer containing no B element, and alternate lamination of the layer containing the B element and the layer containing no B element is not formed in the coated cutting tool of WO 2017/009101, so that the thermal shock resistance in high speed machining is insufficient. For the above reason, the coated cutting tool of WO 2017/009101 has room for improvement in the wear resistance and fracture resistance in high-speed machining.

The present invention has been made in light of the above circumstances, and an object of the present invention is to provide a coated cutting tool capable of extending the tool life in both high-speed machining and high-feed machining.

Solution to Problem

The present inventors have conducted research on extending a tool life of a coated cutting tool, and has found that when the coated cutting tool has a specific configuration, the tool life in both high-speed machining and high-feed machining can be extended. Thus, the invention has been completed.

That is, the gist of the present invention is as follows.

[1] A coated cutting tool comprising a substrate and a coating layer formed on the substrate, wherein the coating layer has a first alternately laminated structure in which two or more A layers and two or more B layers are alternately formed;

the A layer contains a compound having a composition represented by a following formula (1):

$$(Al_aCr_bTi_{1-a-b})N \qquad (1)$$

(in the formula (1), a is a content (atomic ratio) of an Al element to a total of the Al element, a Cr element, and a Ti element, and satisfies 0.50≤a≤0.68;

b is a content (atomic ratio) of the Cr element to the total of the Al element, the Cr element, and the Ti element, and satisfies 0.02≤b≤0.30; and 1−a−b is a content (atomic ratio) of the Ti element to the total of the Al element, the Cr element, and the Ti element, and satisfies $0.11 \leq 1-a-b \leq 0.40$);

the B layer contains a compound having a composition represented by a following formula (2):

$$(Al_cTi_{1-c-d}B_d)N \quad (2)$$

(in the formula (2), c is a content (atomic ratio) of the Al element to a total of the Al element, the Ti element, and a B element, and satisfies $0.30 \leq c \leq 0.64$;

d is a content (atomic ratio) of the B element to the total of the Al element, the Ti element, and the B element, and satisfies $0.01 \leq d \leq 0.10$; and 1−c−d is a content (atomic ratio) of the Ti element to the total of the Al element, the Ti element, and the B element, and satisfies $0.30 \leq 1-c-d \leq 0.69$);

an average thickness of the first alternately laminated structure is 0.50 μm or more and 10.00 μm or less;

an average thickness per layer of the A layer in the first alternately laminated structure is 2 nm or more and 300 nm or less; and an average thickness per layer of the B layer in the first alternately laminated structure is 2 nm or more and 300 nm or less.

[2] The coated cutting tool according to [1], wherein a ratio ((1−a−b)/d) of the content (atomic ratio) of the Ti element in the A layer to the content (atomic ratio) of the B element in the B layer is 2.0 or more and 25.0 or less.

[3] The coated cutting tool according to [1] or [2], wherein an average value ((a+c)/2) of the content (atomic ratio) of the Al element in the A layer and the content (atomic ratio) of the Al element in the B layer is 0.50 or more and 0.62 or less.

[4] The coated cutting tool according to any of [1] to [3], wherein the coating layer further has a second alternately laminated structure in which two or more A layers and two or more C layers are alternately formed;

the C layer contains a compound having a composition represented by a following formula (3):

$$(Al_eTi_{1-e})N \quad (3)$$

(in the formula (3), e is a content (atomic ratio) of the Al element to a total of the Al element and the Ti element, and satisfies $0.30 \leq e \leq 0.64$;

1−e is a content (atomic ratio) of the Ti element to the total of the Al element and the Ti element, and satisfies $0.36 \leq 1-e \leq 0.70$);

an average thickness of the second alternately laminated structure is 0.50 μm or more and 5.00 μm or less;

an average thickness per layer of the A layer in the second alternately laminated structure is 2 nm or more and less than 30 nm; and an average thickness per layer of the C layer in the second alternately laminated structure is 2 nm or more and less than 30 nm.

[5] The coated cutting tool according to any of [1] to [4], wherein the average thickness per layer of the A layer in the first alternately laminated structure is 30 nm or more and 300 nm or less; and the average thickness per layer of the B layer in the first alternately laminated structure is 30 nm or more and 300 nm or less.

[6] The coated cutting tool according to [4], wherein the coating layer has a third alternately laminated structure in which the first alternately laminated structure and the second alternately laminated structure are alternately formed three or more times in total;

an average thickness per structure of the first alternately laminated structure in the third alternately laminated structure is 0.1 μm or more and 1.5 μm or less; and an average thickness per structure of the second alternately laminated structure in the third alternately laminated structure is 0.1 μm or more and 1.5 μm or less.

[7] The coated cutting tool according to any of [1] to [6], wherein a ratio (I(111)/I(200)) of a diffraction peak intensity (I(111)) of a cubic crystal (111) plane to a diffraction peak intensity (I(200)) of a cubic crystal (200) plane is 0.5 or more and 5.0 or less in X-ray diffraction of the first alternately laminated structure.

[8] The coated cutting tool according to [6], wherein a ratio (I(111)/I(200)) of a diffraction peak intensity (I(111)) of a cubic crystal (111) plane to a diffraction peak intensity (I(200)) of a cubic crystal (200) plane is 0.5 or more and 5.0 or less in X-ray diffraction of the third alternately laminated structure.

[9] The coated cutting tool according to any of [1] to [8], wherein the coating layer has an upper layer on a surface opposite to the substrate in the first alternately laminated structure or the third alternately laminated structure;

the upper layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B (provided that, a composition of the compound constituting the upper layer is different from a composition of the compound constituting the first alternately laminated structure or the second alternately laminated structure being in contact with the upper layer); and an average thickness of the upper layer is 0.01 μm or more and 2.00 μm or less.

[10] The coated cutting tool according to any of [1] to [9], wherein the coating layer has a lower layer between the substrate and the first alternately laminated structure or the third alternately laminated structure;

the lower layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B (provided that, a composition of the compound constituting the lower layer is different from a composition of the compound constituting the first alternately laminated structure or the second alternately laminated structure being in contact with the lower layer); and an average thickness of the lower layer is 0.01 μm or more and 2.00 μm or less.

[11] The coated cutting tool according to any of [1] to [10], wherein an average thickness of the entire coating layer is 0.5 μm or more and 10.0 μm or less.

Advantageous Effects of Invention

According to the present invention, it is possible to provide a coated cutting tool capable of extending the tool life in both high-speed machining and high-feed machining.

DETAILED DESCRIPTION

Figure 1:
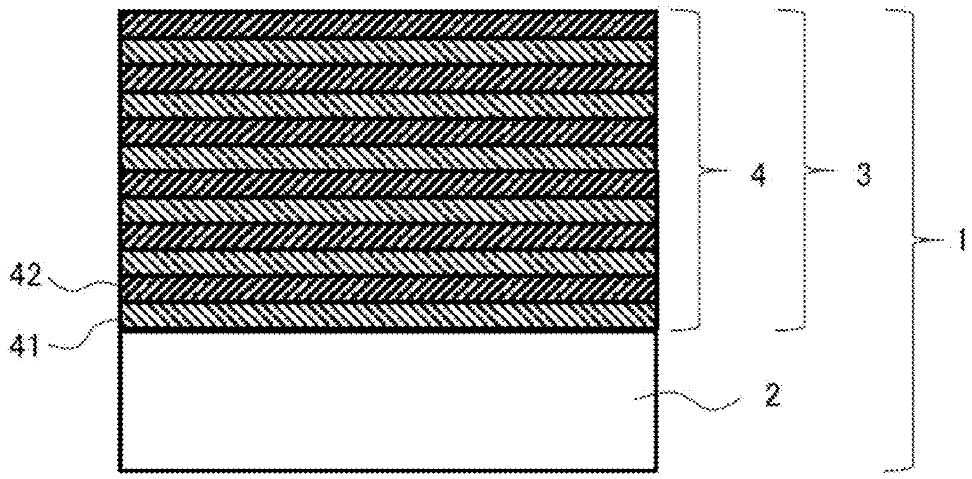
FIG. 1 is a schematic view showing an example of a coated cutting tool of the present invention.

Hereinafter, an embodiment for implementing the present invention (hereinafter, simply referred to as "the present embodiment") will be described in detail, but the present invention is not limited to the following embodiment. The present invention can be modified in various ways without departing from the gist thereof. In the drawings, the same elements are designated by the same reference numerals, and repeated description will be omitted. Further, unless otherwise specified, a positional relationship such as up, down, left, and right is based on a positional relationship shown in the drawing. Furthermore, a dimensional ratio in the drawing is not limited to a ratio shown.

The coated cutting tool of the present embodiment is a coated cutting tool including a substrate and a coating layer formed on the substrate, wherein the coating layer has a first alternately laminated structure in which two or more A layers and two or more B layers are alternately formed, the A layer contains a compound having a composition represented by a following formula (1):

$$(Al_aCr_bTi_{1-a-b})N \quad (1)$$

(in the formula (1), a is a content (atomic ratio) of an Al element to a total of the Al element, a Cr element, and a Ti element, and satisfies 0.50≤a≤0.68;

b is a content (atomic ratio) of the Cr element to the total of the Al element, the Cr element, and the Ti element, and satisfies 0.02≤b≤0.30; and 1−a−b is a content (atomic ratio) of the Ti element to the total of the Al element, the Cr element, and the Ti element, and satisfies 0.11≤1−a−b≤0.40);

the B layer contains a compound having a composition represented by a following formula (2):

$$(Al_cTi_{1-c-d}B_d)N \quad (2)$$

(in the formula (2), c is a content (atomic ratio) of the Al element to a total of the Al element, the Ti element, and a B element, and satisfies 0.30≤c≤0.64;

d is a content (atomic ratio) of the B element to the total of the Al element, the Ti element, and the B element, and satisfies 0.01≤d≤0.10; and 1−c−d is a content (atomic ratio) of the Ti element to the total of the Al element, the Ti element, and the B element, and satisfies 0.30≤1−c−d≤0.69);

an average thickness of the first alternately laminated structure is 0.50 μm or more and 10.00 μm or less;

an average thickness per layer of the A layer in the first alternately laminated structure is 2 nm or more and 300 nm or less; and an average thickness per layer of the B layer in the first alternately laminated structure is 2 nm or more and 300 nm or less.

Factors why such a coated cutting tool has a long tool life in both high-speed machining and high-feed machining are not clear in detail, but it is estimated as follows. However, the factors are not limited thereto.

When the content a of the Al element in $(Al_aCr_bTi_{1-a-b})N$ which is the composition represented by the formula (1) is 0.50 or more in the A layer which forms the first alternately laminated structure, the hardness is increased and the oxidation resistance is improved, so that the coated cutting tool is excellent in the wear resistance in high-speed machining. Meanwhile, when the content a of the Al element is 0.68 or less, the formation of hexagonal crystals is suppressed, so that the hardness is increased, the coated cutting tool is excellent in the wear resistance in high speed machining, the thermal stability in the vicinity of the interface between the A layer and the B layer is improved, the effect of improving thermal shock resistance is obtained, and further, the fracture resistance of the coated cutting tool in high-speed machining is improved.

When the content b of the Cr element in $(Al_aCr_bTi_{1-a-b})N$ which is the composition represented by the formula (1) is 0.02 or more in the A layer which forms the first alternately laminated structure, the formation of hexagonal crystals is suppressed, so that the hardness is increased, the coated cutting tool is excellent in the wear resistance in high-speed machining, the thermal stability in the vicinity of the interface between the A layer and the B layer is improved, the effect of improving thermal shock resistance is obtained, and further, the fracture resistance of the coated cutting tool in high-speed machining is improved. Meanwhile, when the content b of the Cr element is 0.30 or less, the toughness is improved and the fracture resistance of the coated cutting tool in both high-speed machining and high-feed machining is improved.

When the content (1−a−b) of the Ti element in $(Al_aCr_bTi_{1-a-b})N$ which is the composition represented by the formula (1) is 0.11 or more in the A layer which forms the first alternately laminated structure, the thermal stability at the interface between the A layer and the B layer is improved, the thermal shock resistance is improved, and the peeling of the coating layer and the propagation of the cracks to the substrate during cutting are suppressed, so that the coated cutting tool is excellent in the fracture resistance in high speed machining. Meanwhile, when the content (1−a−b) of the Ti element is 0.40 or less and the content a of the Al element is relatively large, the hardness is increased, the oxidation resistance is improved, and the coated cutting tool is excellent in the wear resistance in high-speed machining, and when the content b of the Cr element is relatively large, the formation of hexagonal crystals is suppressed, so that the hardness is increased and the coated cutting tool is excellent in the wear resistance in high-speed machining.

Then, when the content c of the Al element in $(Al_cTi_{1-c-d}B_d)N$ which is the composition represented by the formula (2) is 0.30 or more in the B layer which forms the first alternately laminated structure, the hardness is increased, the oxidation resistance is improved, and the coated cutting tool is excellent in the wear resistance in high-speed machining. Meanwhile, when the content c of the Al element is 0.64 or less, the formation of hexagonal crystals is suppressed, so that the hardness is increased, the coated cutting tool is excellent in the wear resistance in high-speed machining, the thermal stability in the vicinity of the interface between the A layer and the B layer is improved, the effect of improving thermal shock resistance is obtained, and further, the fracture resistance of the coated cutting tool in high-speed machining is improved.

When the content d of the B element in $(Al_cTi_{1-c-d}B_d)N$ which is the composition represented by the formula (2) is 0.01 or more in the B layer which forms the first alternately laminated structure, the hardness is increased and the coated cutting tool is excellent in the wear resistance in high-speed machining. Meanwhile, when the content d of the B element is 0.10 or less, the toughness is improved and the fracture resistance of the coated cutting tool in both high-speed machining and high-feed machining is improved.

When the content (1−c−d) of the Ti element in $(Al_c Ti_{1-c-d}B_d)N$ which is the composition represented by the formula (2) is 0.30 or more in the B layer which forms the first alternately laminated structure, the thermal stability at the interface between the A layer and the B layer is improved, the thermal shock resistance is improved, and the peeling of the coating layer and the propagation of the cracks to the substrate during cutting are suppressed, so that the coated cutting tool is excellent in the fracture resistance in high speed machining. Meanwhile, when the content (1−c−d) of the Ti element is 0.69 or less and the content c of the Al element is relatively large, the hardness is increased, the oxidation resistance is improved, and the coated cutting tool is excellent in the wear resistance in high-speed machining, and when the content d of the B element is relatively large, the hardness is increased and the coated cutting tool is excellent in the wear resistance in high-speed machining.

The coated cutting tool of the present embodiment has the first alternately laminated structure in which two or more A layers and B layers each containing a compound having such a specific composition are alternately formed, so that the thermal shock resistance is improved, and thus, the fracture resistance is excellent in high-speed machining.

When the average thickness of the first alternately laminated structure is 0.50 μm or more, the wear resistance of the coated cutting tool in high speed machining is improved. Meanwhile, when the average thickness of the first alternately laminated structure is 10.00 μm or less, the peeling of the coating layer can be suppressed and the fracture resistance of the coated cutting tool in both high-speed machining and high-feed machining is improved.

When the average thickness per layer of the A layer and the B layer is 2 nm or more in the first alternately laminated structure, the effect of suppressing the propagation of the cracks to the substrate occurring during machining is improved and the fracture resistance of the coated cutting tool in both high-speed machining and high-feed machining is improved. Meanwhile, when the average thickness per layer of the A layer and the B layer is 300 nm or less in the first alternately laminated structure, the effect due to inclusion of the alternately laminated structure composed of two different kinds of layers is obtained, the hardness is increased, the coated cutting tool is excellent in the wear resistance in high-speed machining, and further, the effect of suppressing the propagation of the cracks to the substrate occurring during machining is obtained, and further, the fracture resistance of the coated cutting tool in both high-speed machining and high-feed machining is improved.

Combined with these effects, the coated cutting tool of the present embodiment can extend the tool life in both high-speed machining and high-feed machining.

The coated cutting tool of the present embodiment includes a substrate and a coating layer formed on the surface of the substrate. The substrate used in this embodiment is not particularly limited as long as it can be used for a coated cutting tool. Examples of such a substrate include a cemented carbide, a cermet, a ceramic, a cubic boron nitride sintered body, a diamond sintered body, and high-speed steel. Among them, the substrate is further preferably one or more selected from a group consisting of a cemented carbide, a cermet, a ceramic, and a cubic boron nitride sintered body, because more excellent wear resistance and fracture resistance of the coated cutting tool can be realized.

In the coated cutting tool of the present embodiment, the average thickness of the entire coating layer is preferably 0.5 μm or more and 10.0 μm or less. In the coated cutting tool of the present embodiment, when the average thickness of the entire coating layer is 0.5 μm or more, the wear resistance of the coated cutting tool in high-speed machining is improved. In the coated cutting tool of the present embodiment, when the average thickness of the entire coating layer is 10.0 μm or less, the fracture resistance in both high-speed machining and high-feed machining is further improved mainly because the peeling of the coating layer is suppressed. From the same viewpoint, the average thickness of the entire coating layer is more preferably 0.6 μm or more and 9.6 μm or less, and further preferably 1.2 μm or more and 7.8 μm or less.

First Alternately Laminated Structure

In the coated cutting tool of the present embodiment, the coating layer has a first alternately laminated structure in which two or more A layers and two or more B layers are alternately formed. Since the coated cutting tool of the present embodiment has a first alternately laminated structure in which two or more A layers and two or more B layers each containing a compound having a specific composition are alternately formed, the thermal shock resistance is improved, and thus, the fracture resistance is excellent in high speed machining.

A Layer

In the coated cutting tool of the present embodiment, the A layer is a compound layer containing a compound having a composition represented by the following formula (1).

$$(Al_aCr_bTi_{1-a-b})N \quad (1)$$

(In the formula (1), a is the content (atomic ratio) of the Al element to the total of the Al element, the Cr element, and the Ti element, and satisfies $0.50 \leq a \leq 0.68$;

b is the content (atomic ratio) of the Cr element to the total of the Al element, the Cr element, and the Ti element, and satisfies $0.02 \leq b \leq 0.30$; and 1−a−b is the content (atomic ratio) of the Ti element to the total of the Al element, the Cr element, and the Ti element, and satisfies $0.11 \leq 1-a-b \leq 0.40$).

In the A layer which forms the first alternately laminated structure, when the content a of the Al element in $(Al_aCr_bTi_{1-a-b})N$ which is the composition represented by the formula (1) is 0.50 or more, the hardness is increased and the oxidation resistance is improved, so that the coated cutting tool is excellent in the wear resistance in high-speed machining. Meanwhile, when the content a of the Al element is 0.68 or less, the formation of hexagonal crystals is suppressed, so that the hardness is increased, the coated cutting tool is excellent in the wear resistance in high speed machining, the thermal stability in the vicinity of the interface between the A layer and the B layer is improved, the effect of improving thermal shock resistance is obtained, and further, the fracture resistance of the coated cutting tool in high-speed machining is improved. From the same viewpoint, the content a of the Al element in $(Al_aCr_bTi_{1-a-b})N$ is preferably 0.51 or more and 0.67 or less, and more preferably 0.55 or more and 0.66 or less.

In the A layer which forms the first alternately laminated structure, when the content b of the Cr element in $(Al_aCr_bTi_{1-a-b})N$ which is the composition represented by the formula (1) is 0.02 or more, the formation of hexagonal crystals is suppressed, so that the hardness is increased, the coated cutting tool is excellent in the wear resistance in high-speed machining, the thermal stability in the vicinity of the interface between the A layer and the B layer is improved, the effect of improving thermal shock resistance is obtained, and further, the fracture resistance of the coated cutting tool in high-speed machining is improved. Meanwhile, when the content b of the Cr element is 0.30 or less, the toughness is improved, and the fracture resistance of the coated cutting tool in both high-speed machining and high-feed machining is improved. From the same viewpoint, the content b of the Cr element in $(Al_aCr_bTi_{1-a-b})N$ is preferably 0.03 or more and 0.29 or less, and more preferably 0.04 or more and 0.25 or less.

In the A layer which forms the first alternately laminated structure, when the content (1−a−b) of the Ti element in $(Al_aCr_bTi_{1-a-b})N$ which is the composition represented by the formula (1) is 0.11 or more, the thermal stability at the interface between the A layer and the B layer is improved, the thermal shock resistance is improved and the peeling of the coating layer and the propagation of the cracks to the substrate during cutting are suppressed, so that the coated cutting tool is excellent in the fracture resistance in high speed machining. Meanwhile, when the content (1−a−b) of the Ti element is 0.40 or less and the content a of the Al element is relatively large, the hardness is increased, the oxidation resistance is improved, and the coated cutting tool is excellent in the wear resistance in high-speed machining, and when the content b of the Cr element is relatively large, the formation of hexagonal crystals is suppressed, so that the hardness is increased and the coated cutting tool is excellent in the wear resistance in high-speed machining. From the same viewpoint, the content (1−a−b) of the Ti element in $(Al_aCr_bTi_{1-a-b})N$ is preferably 0.12 or more and 0.38 or less, and more preferably 0.15 or more and 0.36 or less.

In the present embodiment, when the composition of each compound layer is expressed as, for example, $(Al_{0.60}Cr_{0.20}Ti_{0.20})N$, it means that the content (atomic ratio) of the Al element to the total of the Al element, the Cr element, and the Ti element is 0.60, the content (atomic ratio) of the Cr element to the total of the Al element, the Cr element, and the Ti element is 0.20, and the content (atomic ratio) of the Ti element to the total of the Al element, the Cr element, and the Ti element is 0.20. That is, it means that the amount of the Al element to the total of the Al element, the Cr element, and the Ti element is 60%, the amount of the Cr element to the total of the Al element, the Cr element, and the Ti element is 20%, and the amount of the Ti element to the total of the Al element, the Cr element, and the Ti element is 20%.

B Layer

In the coated cutting tool of the present embodiment, the B layer is a compound layer containing a compound having a composition represented by the following formula (2).

$$(Al_cTi_{1-c-d}B_d)N \quad (2)$$

(In the formula (2), c is the content (atomic ratio) of the Al element to the total of the Al element, the Ti element, and the B element, and satisfies $0.30 \le c \le 0.64$;

d is the content (atomic ratio) of the B element to the total of the Al element, the Ti element, and the B element, and satisfies $0.01 \le c \le 0.10$; and 1−c−d is the content (atomic ratio) of the Ti element to the total of the Al element, the Ti element, and the B element, and satisfies $0.30 \le 1-c-d \le 0.69$).

In the B layer which forms the first alternately laminated structure, when the content c of the Al element in $(Al_cTi_{1-c-d}B_d)N$ which is the composition represented by the formula (2) is 0.30 or more, the hardness is increased, the oxidation resistance is improved, and the coated cutting tool is excellent in the wear resistance in high-speed machining. Meanwhile, when the content c of the Al element is 0.64 or less, the formation of hexagonal crystals is suppressed, so that the hardness is increased, the coated cutting tool is excellent in the wear resistance in high-speed machining, the thermal stability in the vicinity of the interface between the A layer and the B layer is improved, the effect of improving thermal shock resistance is obtained, and further, the fracture resistance of the coated cutting tool in high-speed machining is improved. From the same viewpoint, the content c of the Al element in $(Al_cTi_{1-c-d}B_d)N$ is preferably 0.31 or more and 0.63 or less, and more preferably 0.33 or more and 0.56 or less.

In the B layer which forms the first alternately laminated structure, when the content d of the B element in $(Al_cTi_{1-c-d}B_d)N$ which is the composition represented by the formula (2) is 0.01 or more, the hardness is increased and the coated cutting tool is excellent in the wear resistance in high-speed machining. Meanwhile, when the content d of the B element is 0.10 or less, the toughness is improved and the fracture resistance of the coated cutting tool in both high-speed machining and high-feed machining is improved. From the same viewpoint, the content d of the B element in $(Al_cTi_{1-c-d}B_d)N$ is preferably 0.02 or more and 0.09 or less, and more preferably 0.02 or more and 0.07 or less.

In the B layer which forms the first alternately laminated structure, when the content (1−c−d) of the Ti element in $(Al_cTi_{1-c-d}B_d)N$ which is the composition represented by the formula (2) is 0.30 or more, the thermal stability at the interface between the A layer and the B layer is improved, the thermal shock resistance is improved and the peeling of the coating layer and the propagation of the cracks to the substrate during cutting are suppressed, so that the coated cutting tool is excellent in the fracture resistance in high speed machining. Meanwhile, when the content (1−c−d) of the Ti element is 0.69 or less and the content c of the Al element is relatively large, the hardness is increased, the oxidation resistance is improved, and the coated cutting tool is excellent in the wear resistance in high-speed machining, and when the content d of the B element is relatively large, the hardness is increased and the coated cutting tool is excellent in the wear resistance in high-speed machining. From the same viewpoint, the content (1−c−d) of the Ti element in $(Al_cTi_{1-c-d}B_d)N$ is preferably 0.32 or more and 0.67 or less, and more preferably 0.37 or more and 0.65 or less.

Further, when the lower layer described below is not formed in the coated cutting tool of the present embodiment, it is preferred first to form the A layer on the surface of the substrate. When the A layer is first formed on the surface of the substrate in the coated cutting tool of the present embodiment, the adhesiveness between the substrate and the coating layer tends to be improved.

The coated cutting tool of the present embodiment has a number of repetitions of the A layer and the B layer of 2 times or more, preferably 5 times or more and 500 times or less, and more preferably 6 times or more and 96 times or less in the first alternately laminated structure.

In the present embodiment, when one A layer and one B layer are formed, the "number of repetitions" is 1 time.

In the coated cutting tool of the present embodiment, the average thickness of the first alternately laminated structure is 0.50 μm or more and 10.00 μm or less. When the average thickness of the first alternately laminated structure is 0.50 μm or more, the wear resistance of the coated cutting tool in high-speed machining is improved. Meanwhile, when the average thickness of the first alternately laminated structure is 10.00 μm or less, the peeling of the coating layer can be suppressed and the fracture resistance of the coated cutting tool in both high-speed machining and high-feed machining is improved. From the same viewpoint, the average thickness of the first alternately laminated structure is preferably 0.60 μm or more and 9.60 μm or less, and more preferably 1.20 μm or more and 7.80 μm or less.

In the present embodiment, for example, when a plurality of first alternately laminated structures and a plurality of second alternately laminated structures are alternately formed as the third alternately laminated structure described below, the average thickness of the first alternately laminated structure described herein is the total thickness of each average thickness of the plurality of first alternately laminated structures.

In the coated cutting tool of the present embodiment, the average thickness per layer of each of the A layer and the B layer in the first alternately laminated structure is 2 nm or more and 300 nm or less. In the first alternately laminated structure, when the average thickness per layer of the A layer and the B layer is 2 nm or more, the effect of suppressing the propagation of the cracks to the substrate occurring during machining is improved and the fracture resistance of the coated cutting tool in both high speed machining and high-feed machining is improved. Meanwhile, in the first alternately laminated structure, when the average thickness per layer of the A layer and the B layer is 300 nm or less, the effect due to inclusion of the alternately laminated structure composed of two different kinds of layers is obtained, the hardness is increased, the coated cutting tool is excellent in the wear resistance in high-speed machining, and further, the effect of suppressing the propagation of the cracks to the substrate occurring during machining is obtained, and further, the fracture resistance of the coated cutting tool in both high-speed machining and high-feed machining is improved. From the same viewpoint, the average thickness per layer of each of the A layer and the B layer in the first alternately laminated structure is preferably 3 nm or more and 280 nm or less, and more preferably 5 nm or more and 150 nm or less.

In the first alternately laminated structure, the average thickness per layer of the A layer and the B layer may be the same or different from each other.

In the first alternately laminated structure, the ratio ((1−a−b)/d) of the content (atomic ratio) of the Ti element in the A layer to the content (atomic ratio) of the B element in the B layer is preferably 2.0 or more and 25.0 or less.

In the first alternately laminated structure, when the ratio ((1−a−b)/d) of the content (atomic ratio) of the Ti element in the A layer to the content (atomic ratio) of the B element in the B layer is 2.0 or more, the thermal stability in the vicinity of the interface between the A layer and the B layer is improved, the effect of improving thermal shock resistance tends to be obtained, the fracture resistance of the coated cutting tool in high-speed machining tends to be improved, and further, the toughness in the vicinity of the interface between the A layer and the B layer tends to be improved, and the fracture resistance of the coated cutting tool in high-feed machining tends to be also improved. Meanwhile, in the first alternately laminated structure, when the ratio ((1−a−b)/d) is 25.0 or less, the effect of improving thermal shock resistance due to inclusion of the first alternately laminated structure by the coating layer tends to be high, and the fracture resistance of the coated cutting tool in high-speed machining tends to be improved. From the same viewpoint, the ratio ((1−a−b)/d) is more preferably 2.4 or more and 24.0 or less, and further preferably 3.0 or more and 13.0 or less.

In the first alternately laminated structure, the average value ((a+c)/2) of the content (atomic ratio) of the Al element in the A layer and the content (atomic ratio) of the Al element in the B layer is preferably 0.50 or more and 0.62 or less.

In the first alternately laminated structure, when the average value ((a+c)/2) of the content (atomic ratio) of the Al element in the A layer and the content (atomic ratio) of the Al element in the B layer is 0.50 or more, the hardness tends to be increased, the oxidation resistance tends to be improved, and the wear resistance of the coated cutting tool in high-speed machining tends to be improved. Meanwhile, in the first alternately laminated structure, when the average value ((a+c)/2) is 0.62 or less, the formation of hexagonal crystals is suppressed, so that the hardness tends to be high, the wear resistance of the coated cutting tool in high-speed machining tends to be improved, and further, the thermal stability in the vicinity of the interface between the A layer and the B layer is improved, so that the thermal shock resistance tends to be further high, and the fracture resistance of the coated cutting tool in high-speed machining tends to be further improved. From the same viewpoint, the average value ((a+c)/2) is more preferably 0.51 or more and 0.61 or less, and further preferably 0.53 or more and 0.60 or less.

Second Alternately Laminated Structure

In the coated cutting tool of the present embodiment, the coating layer preferably further has the second alternately laminated structure in which two or more A layers and two or more C layers are alternately formed.

The C layer in the second alternately laminated structure contains a compound having a composition represented by the following formula (3).

$$(Al_eTi_{1-e})N \quad (3)$$

(In the formula (3), e is the content (atomic ratio) of the Al element to the total of the Al element and the Ti element, and satisfies $0.30 \leq e \leq 0.64$; and $1-e$ is the content (atomic ratio) of the Ti element to the total of the Al element and the Ti element, and satisfies $0.36 \leq 1-e \leq 0.70$).

The A layer in the second alternately laminated structure is the same as the A layer in the first alternately laminated structure.

When the second alternately laminated structure is formed on the surface of the substrate side of the first alternately laminated structure, the adhesiveness between the coating layer and the substrate tends to be further improved. When the second alternately laminated structure is formed on the surface opposite to the substrate of the first alternately laminated structure or formed between two first alternate laminations, the effect of suppressing the propagation of the cracks to the substrate occurring during machining tends to be further improved.

For the above reason, in the coated cutting tool of the present embodiment, when the coating layer has the second alternately laminated structure, the fracture resistance tends to be further improved in both high speed machining and high-feed machining.

C Layer

In the coated cutting tool of the present embodiment, the C layer is a compound layer containing a compound having a composition represented by the above formula (3).

In the C layer which forms the second alternately laminated structure, the content e of the Al element in $(Al_eTi_{1-e})N$ which is the composition represented by the formula (3) is 0.30 or more, the hardness tends to be increased, the oxidation resistance tends to be improved, and the wear resistance of the coated cutting tool in high-speed machining tends to be improved. Meanwhile, in the C layer which forms the second alternately laminated structure, the content e of the Al element in $(Al_eTi_{1-e})N$ which is the composition represented by the formula (3) is 0.64 or less, the formation of hexagonal crystals is suppressed, so that the hardness tends to be high and the wear resistance of the coated cutting tool in high-speed machining tends to be improved. From the same viewpoint, the content e of the Al element in $(Al_eTi_{1-e})N$ which is the composition represented by the formula (3) is preferably 0.35 or more and 0.60 or less, and more preferably 0.40 or more and 0.55 or less.

In the C layer which forms the second alternately laminated structure, the content (1−e) of the Ti element in $(Al_eTi_{1-e})N$ which is the composition represented by the formula (3) is 0.36 or more, the formation of hexagonal crystals is suppressed, so that the hardness tends to be high and the wear resistance of the coated cutting tool in high-speed machining tends to be improved. Meanwhile, in the C layer which forms the second alternately laminated structure, when the content (1−e) of the Ti element in $(Al_eTi_{1-e})N$ which is the composition represented by the formula (3) is 0.70 or less, the hardness tends to be increased, the oxidation resistance tends to be improved, and the wear resistance of the coated cutting tool in high-speed machining tends to be improved. From the same viewpoint, the content (1−e) of the Ti element in $(Al_eTi_{1-e})N$ which is the composition represented by the formula (3) is preferably 0.40 or more and 0.65 or less, and more preferably 0.45 or more and 0.60 or less.

The coated cutting tool of the present embodiment has a number of repetitions of the A layer and the C layer of 2 times or more, preferably 5 times or more and 250 times or less, and more preferably 6 times or more and 75 times or less in the second alternately laminated structure.

In the present embodiment, when one A layer and one C layer are formed, the "number of repetitions" is 1 time.

In the coated cutting tool of the present embodiment, the average thickness of the second alternately laminated structure is preferably 0.50 μm or more and 5.00 μm or less. When the average thickness of the second alternately laminated structure is 0.50 μm or more, the wear resistance of the coated cutting tool in high-speed machining tends to be improved. Meanwhile, when the average thickness of the second alternately laminated structure is 5.00 μm or less, the peeling of the coating layer can be suppressed, and the fracture resistance of the coated cutting tool in both high-speed machining and high-feed machining tends to be further improved. From the same viewpoint, the average thickness of the second alternately laminated structure is preferably 0.60 μm or more and 4.50 μm or less, and more preferably 1.00 μm or more and 3.00 μm or less.

In the present embodiment, for example, when a plurality of first alternately laminated structures and a plurality of second alternately laminated structures are alternately formed as the third alternately laminated structure described below, the average thickness of the second alternately laminated structure described herein is the total thickness of each average thickness of the plurality of second alternately laminated structures.

In the coated cutting tool of the present embodiment, the average thickness per layer of each of the A layer and the C layer in the second alternately laminated structure is preferably 2 nm or more and less than 30 nm. In the second alternately laminated structure, when the average thickness per layer of the A layer and the C layer is 2 nm or more, the effect of suppressing the propagation of the cracks to the substrate occurring during machining tends to be improved and the fracture resistance of the coated cutting tool in both high-speed machining and high-feed machining tends to be improved. Meanwhile, in the second alternately laminated structure, when the average thickness per layer of the A layer and the C layer is less than 30 nm, a reduction in the adhesiveness due to the difference in residual stress between the first alternately laminated structure and the second alternately laminated structure is suppressed and peeling is suppressed, so that the fracture resistance of the coated cutting tool in both high-speed machining and high-feed machining tends to be further improved. From the same viewpoint, the average thickness per layer of each of the A layer and the C layer in the second alternately laminated structure is preferably 3 nm or more and 27 nm or less, and more preferably 4 nm or more and 25 nm or less.

In the second alternately laminated structure, the average thickness per layer of the A layer and the C layer may be the same or different from each other.

The average thickness per layer of each layer which forms the first alternately laminated structure is preferably made larger than the average thickness per layer of each layer which forms the second alternately laminated structure. In the first alternately laminated structure containing the B element, residual stress is likely to be high. Thus, the difference in residual stress between the first alternately laminated structure and the second alternately laminated structure tends to be reduced by making the average thickness per layer of each layer which forms the first alternately laminated structure larger than the average thickness per layer of each layer which forms the second alternately laminated structure, and further preferably, by setting the average thickness per layer of each layer to each of the aforementioned ranges. In this case, specifically, for example, the average thickness per layer of the A layer and the B layer in the first alternately laminated structure is preferably 30 nm or more and 300 nm or less. When the average thickness per layer of the A layer and the B layer in the first alternately laminated structure is 30 nm or more, the reduction in adhesiveness due to the difference in residual stress between the first alternate lamination and the second alternate lamination is suppressed and peeling is suppressed, so that the fracture resistance of the coated cutting tool in both high-speed machining and high-feed machining tends to be further improved. When the average thickness per layer of the A layer and the B layer in the first alternately laminated structure is 300 nm or less, the effect of having the first alternate lamination is exerted, the toughness is improved, so that the fracture resistance of the coated cutting tool tends to be excellent.

Third Alternately Laminated Structure

In the coated cutting tool of the present embodiment, the coating layer preferably has the third alternately laminated structure in which the first alternately laminated structure and the second alternately laminated structure are alternately formed three or more times in total. When the coated cutting tool of the present embodiment has the third alternately laminated structure, the effect of suppressing the propagation of the cracks to the substrate occurring during machining tends to be further increased and fracture resistance tends to be further improved in both high-speed machining and high-feed machining.

In the case of having the third alternately laminated structure in the coated cutting tool of the present embodiment, the average thickness per structure of the first alternately laminated structure in the third alternately laminated structure is preferably 0.1 μm or more and 1.5 μm or less. In the case of having the third alternately laminated structure in the coated cutting tool of the present embodiment, the average thickness per structure of the first alternately laminated structure of 0.1 μm or more suppresses a reduction in the adhesiveness due to the difference in residual stress between the first alternately laminated structure and the second alternately laminated structure, so that the fracture resistance in both high-speed machining and high-feed machining tends to be further improved. Meanwhile, in the case of having the third alternately laminated structure in the coated cutting tool of the present embodiment, the average thickness per structure of the first alternately laminated structure of 1.5 μm or less allows the effect due to inclusion of the third alternately laminated structure to be obtained, so that the effect of suppressing the propagation of the cracks to the substrate occurring during machining tends to be further improved and the fracture resistance in both high-speed machining and high-feed machining tends to be further improved. From the same viewpoint, in the case of having the third alternately laminated structure, the average thickness per structure of the first alternately laminated structure is more preferably 0.2 μm or more and 1.2 μm or less, and further preferably 0.2 μm or more and 1.0 μm or less.

In the present embodiment, the average thickness per structure of the first alternately laminated structure in the third alternately laminated structure refers to a value obtained by dividing the total thickness of the average thickness of each first alternately laminated structure formed in the third alternately laminated structure by the number of the formed first alternately laminated structures. For example, when the coating layer has a configuration such as "the substrate/the first alternately laminated structure/the second alternately laminated structure/the first alternately laminated structure/the second alternately laminated structure/the first alternately laminated structure/the second alternately laminated structure (the outermost surface)", it is a value obtained by dividing the total thickness of three average thicknesses of each first alternately laminated structure formed in the third alternately laminated structure by the number of the formed first alternately laminated structures "3".

In the case of having the third alternately laminated structure in the coated cutting tool of the present embodiment, the average thickness per structure of the second alternately laminated structure in the third alternately laminated structure is preferably 0.1 μm or more and 1.5 μm or less. In the case of having the third alternately laminated structure in the coated cutting tool of the present embodiment, the average thickness per structure of the second alternately laminated structure of 0.1 μm or more suppresses a reduction in the adhesiveness due to the difference in residual stress between the first alternately laminated structure and the second alternately laminated structure, so that the fracture resistance in both high-speed machining and high-feed machining tends to be further improved. Meanwhile, in the case of having the third alternately laminated structure in the coated cutting tool of the present embodiment, the average thickness per structure of the second alternately laminated structure of 1.5 μm or less allows the effect due to inclusion of the third alternately laminated structure to be obtained, so that the effect of suppressing the propagation of the cracks to the substrate occurring during machining tends to be further improved and the fracture resistance in both high-speed machining and high-feed machining tends to be further improved. From the same viewpoint, in the case of having the third alternately laminated structure, the average thickness per structure of the second alternately laminated structure is more preferably 0.2 μm or more and 0.6 μm or less, and further preferably 0.3 μm or more and 0.6 μm or less.

In the present embodiment, the average thickness per structure of the second alternately laminated structure in the third alternately laminated structure refers to a value obtained by dividing the total thickness of the average thickness of each second alternately laminated structure formed in the third alternately laminated structure by the number of the formed second alternately laminated structures. For example, when the coating layer has a configuration such as "the substrate/the first alternately laminated structure/the second alternately laminated structure/the first alternately laminated structure/the second alternately laminated structure/the first alternately laminated structure/the second alternately laminated structure (the outermost surface)", it is a value obtained by dividing the total thickness of three average thicknesses of each second alternately laminated structure formed in the third alternately laminated structure by the number of the formed second alternately laminated structures "3".

The coated cutting tool of the present embodiment preferably has a number of repetitions of the first alternately laminated structure and the second alternately laminated structure of 1.5 times or more and 45 times or less, and more preferably 2.5 times or more and 9 times or less, in the third alternately laminated structure.

In the present embodiment, when one first alternately laminated structure and one second alternately laminated structure are formed, the "number of repetitions" is 1 time, and for example, when three alternately laminated structures are formed in total as the first alternately laminated structure/the second alternately laminated structure/the first alternately laminated structure, the "number of repetitions" is 1.5 times.

In the coated cutting tool of the present embodiment, when the coating layer is composed of the first alternately laminated structure, a ratio (I(111)/I(200)) of a diffraction peak intensity (I(111)) of a cubic crystal (111) plane to a diffraction peak intensity (I(200)) of a cubic crystal (200) plane is preferably 0.5 or more and 5.0 or less in X-ray diffraction of the first alternately laminated structure.

In the coated cutting tool of the present embodiment, when the coating layer has the third alternately laminated structure, the ratio (I(111)/I(200)) of the diffraction peak intensity (I(111)) of the cubic crystal (111) plane to the diffraction peak intensity (I(200)) of the cubic crystal (200) plane is preferably 0.5 or more and 5.0 or less in X-ray diffraction of the third alternately laminated structure.

In the coated cutting tool of the present embodiment, when the ratio (I(111)/I(200)) of the diffraction peak intensity (I(111)) of the cubic crystal (111) plane to the diffraction peak intensity (I(200)) of the cubic crystal (200) plane is 0.5 or more in X-ray diffraction of the first alternately laminated structure or the third alternately laminated structure, the hardness of the coating layer is high, so that wear resistance tends to be excellent. Meanwhile, in the coated cutting tool of the present embodiment, when the ratio (I(111)/I(200)) of the diffraction peak intensity is 5.0 or less, the toughness of the coating layer is improved, so that the fracture resistance tends to be excellent. From the same viewpoint, the ratio (I(111)/I(200)) of the diffraction peak intensity is more preferably 1.1 or more and 4.8 or less, and further preferably 1.8 or more and 4.5 or less.

In the present embodiment, the measurement positions in the case of calculating the diffraction peak intensity ratio are set to any three locations included in a portion involved in cutting (such locations are preferably selected so as to be apart from one another by 0.5 mm or more, such that the relevant stresses typify the stresses of the above portion).

The peak intensity of each plane index in the coating layer of the present embodiment can be calculated by using a commercially available X-ray diffractometer. For example, the above peak intensity of each plane index can be measured by using an X-ray diffractometer, model name: SmartLab manufactured by Rigaku Corporation and performing X-ray diffraction measurement with a 2θ/θ focused optical system using Cu-Kα rays under the following conditions. Here, the measurement conditions are output: 45 kV, 200 mA, incident side solar slit: 5°, divergent vertical slit: ⅔°, divergent vertical limiting slit: 5 mm, scattering slit: 8 mm, light receiving side solar slit: 5°, light receiving slit: 0.3 mm, sampling width: 0.02°, scan speed: 1°/min, and 2θ measurement range: 30° to 90°. When obtaining the above peak intensity of each plane index from the X-ray diffraction pattern, the analysis software provided with the X-ray diffractometer may be used. In the analysis software, each peak intensity can be obtained by performing background processing and Kα2 peak removal using a cubic approximation, and performing profile fitting using the Pearson-VII function. Specifically, each peak intensity can be measured and calculated by the method described in Examples described below.

FIG. 1 is a schematic cross-sectional view showing an example of a coated cutting tool of the present embodiment. The coated cutting tool 1 includes a substrate 2 and a coating layer 3 formed on the surface of the substrate 2. The coating layer 3 has a first alternately laminated structure 4 in which the A layer 41 and the B layer 42 are alternately formed from the substrate 2 side. In the first alternately laminated structure shown in FIG. 1, each of the A layer 41 and the B layer 42 is alternately repeated 6 times.

Figure 2:
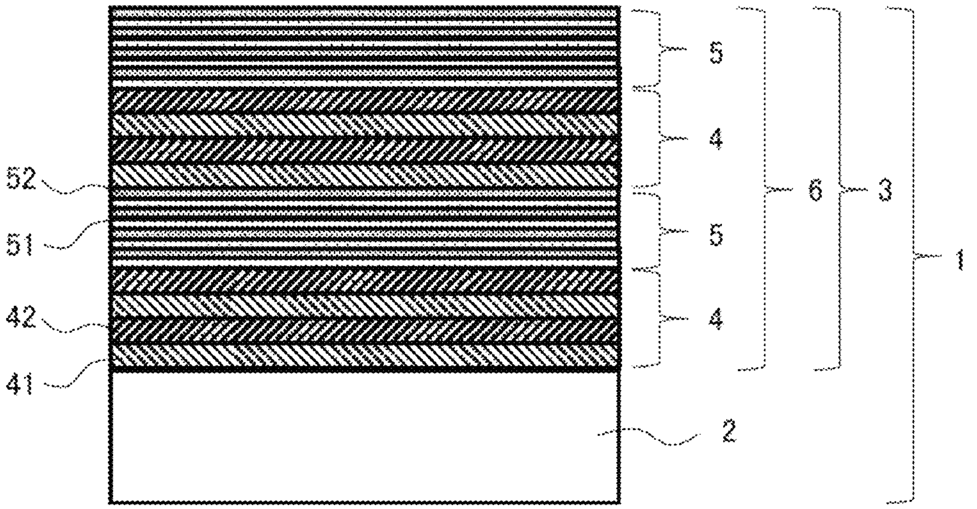
FIG. 2 is a schematic view showing another example of a coated cutting tool of the present invention.

FIG. 2 is a schematic cross-sectional view showing another example of the coated cutting tool of the present embodiment. The coated cutting tool 1 includes a substrate 2 and a coating layer 3 formed on the surface of the substrate 2. The coating layer 3 has a third alternately laminated structure 6 in which a first alternately laminated structure 4 and a second alternately laminated structure 5 are alternately formed from the substrate 2 side. In the first alternately laminated structure 4, an A layer 41 and a B layer 42 are alternately formed from the substrate 2 side. In the second alternately laminated structure 5, an A layer 51 and a C layer 52 are alternately formed from the substrate 2 side. In the third alternately laminated structure shown in FIG. 2, each of the first alternately laminated structure 4 and the second alternately laminated structure 5 is alternately repeated 2 times.

Lower Layer

The coating layer used in the present embodiment may be composed of the aforementioned first alternately laminated structure or third alternately laminated structure, but it is preferable to include a lower layer between the substrate and the first alternately laminated structure or the third alternately laminated structure. The adhesiveness between the substrate and the coating layer tends to be further improved by having the lower layer. From the same viewpoint, the lower layer is preferably a single layer or a multilayer of a compound composed of at least one element selected from the group consisting of Ti, Zr, Hf, V, Nb, Ta, Cr, Mo, W, Al, Si, B, and Y and at least one element selected from the group consisting of C, N, O, and B (provided that, the composition of the compound constituting the lower layer is different from the composition of the compound constituting the first alternately laminated structure or the second alternately laminated structure being in contact with the lower layer), more preferably a single layer or a multilayer of a compound composed of at least one element selected from the group consisting of Ti, V, Nb, Ta, Cr, Mo, W, Al, Si, and Y and at least one element selected from the group consisting of C, N, O, and B, further preferably a single layer or a multilayer of a compound composed of at least one element selected from the group consisting of Ti, Ta, Cr, Mo, W, Al, Si, and Y, and at least one element selected from the group consisting of N and B, and particularly preferably a single layer or a multilayer of a compound composed of at least one element selected from the group consisting of Ti, Cr, Mo, and Al, and N. The specific compound included in the lower layer is not particularly limited, and examples thereof include TiMoN, CrN, TiAlCrN, TiAlN, TiN, TiCN, and AlCrN.

In the coated cutting tool of the present embodiment, it is preferable that the average thickness of the lower layer be 0.01 μm or more and 2.00 μm or less. In the coated cutting tool of the present embodiment, when the average thickness of the lower layer is 0.01 μm or more, the adhesiveness between the coating layer and the substrate tends to be further improved, and the fracture resistance tends to be further improved in both high-speed machining and high-feed machining. Meanwhile, in the coated cutting tool of the present embodiment, when the average thickness of the lower layer is 2.00 μm or less, the peeling of the coating layer is suppressed, and the fracture resistance tends to be further improved in both high-speed machining and high-feed machining. From the same viewpoint, the average thickness of the lower layer is more preferably 0.02 μm or more and 1.00 μm or less, and further preferably 0.10 μm or more and 0.50 μm or less.

Upper Layer

The coating layer used in the present embodiment may be composed of only the first alternately laminated structure or the third alternately laminated structure described above, but may include an upper layer on the surface opposite to the substrate in the first alternately laminated structure or the third alternately laminated structure. The upper layer is preferably a single layer or a multilayer of a compound composed of the composition represented by the compound formula (1) to formula (3) composed of at least one element selected from the group consisting of Ti, Zr, Hf, V, Nb, Ta, Cr, Mo, W, Al, Si, and Y and at least one element selected from the group consisting of C, N, O, and B (provided that, the composition of the compound constituting the upper layer is different from the composition of the compound constituting the first alternately laminated structure or the second alternately laminated structure being in contact with the upper layer). When the upper layer is a single layer or a multilayer of the compound as described above, the wear resistance tends to be more excellent. From the same viewpoint, the upper layer more preferably includes a compound composed of at least one element selected from the group consisting of Ti, V, Nb, Ta, Cr, Mo, W, Al, Si, and Y, and at least one element selected from the group consisting of C, N, O, and B, further preferably a compound composed of at least one element selected from the group consisting of Ti, Nb, Ta, Cr, Mo, W, Al, Si, and Y, and at least one element selected from the group consisting of N and B, and particularly preferably a compound composed of at least one element selected from the group consisting of Ti, Nb, Mo, Al, and Si, and at least one element selected from the group consisting of N and B. The specific compound included in the upper layer is not particularly limited, and examples thereof include TiN, TiAlN, TiSiN, TiMoN, NbN, and TiAlBN. Further, the upper layer may be a single layer or may be a multilayer of two or more layers.

In the coated cutting tool of the present embodiment, the average thickness of the upper layer is preferably 0.01 μm or more and 2.00 μm or less. In the coated cutting tool of the present embodiment, when the average thickness of the upper layer is 0.01 μm or more, the wear resistance tends to be excellent in high-speed machining. Meanwhile, in the coated cutting tool of the present embodiment, when the average thickness of the upper layer is 2.00 μm or less, the peeling of the coating layer is suppressed, and the fracture resistance tends to be further improved in both high-speed machining and high-feed machining. From the same viewpoint, the average thickness of the upper layer is more preferably 0.20 μm or more and 1.50 μm or less, and further preferably 0.50 μm or more and 1.50 μm or less.

Method for Manufacturing Coating Layer A method of manufacturing the coating layer in the coated cutting tool of the present embodiment is not particularly limited, and examples thereof include a physical vapor deposition method such as an ion plating method, an arc ion plating method, a sputtering method, and an ion mixing method. Use of the physical vapor deposition method for forming the coating layer is preferred because a sharp edge can be formed. Among them, the arc ion plating method is more preferred because the adhesiveness between the coating layer and the substrate is more excellent.

Method for Manufacturing Coated Cutting Tool

A method of manufacturing the coated cutting tool of the present embodiment will be described below with reference to specific examples. The method of manufacturing the coated cutting tool of the present embodiment is not particularly limited as long as a configuration of the coated cutting tool can be implemented.

First, a substrate processed into a tool shape is housed in a reaction vessel of a physical vapor deposition device, and a metal evaporation source is disposed in the reaction vessel. Then, the inside of the reaction vessel is evacuated until a pressure thereof is a vacuum of $1.0\times10^{-2}$ Pa or less, and the temperature of the substrate is controlled to a temperature of 200° C. to 700° C. by a heater in the reaction vessel. After heating, Ar gas is introduced into the reaction vessel to make the pressure in the reaction vessel to 0.5 Pa to 5.0 Pa. In an Ar gas atmosphere with a pressure of 0.5 Pa to 5.0 Pa, a bias voltage of −500 V to −350 V is applied to the substrate, a current of 40 A to 50 A is flowed through a tungsten filament in the reaction vessel, and the surface of the substrate is subjected to an ion bombardment treatment with Ar gas. After the surface of the substrate is subjected to the ion bombardment treatment, the inside of the reaction vessel is evacuated until the pressure is a vacuum of $1.0\times10^{-2}$ Pa or less.

When forming the lower layer used in the present embodiment, the substrate is controlled until the temperature reaches 300° C. to 500° C. After controlling, gas is introduced into the reaction vessel to make the pressure inside the reaction vessel to 3.0 Pa to 5.0 Pa. The gas is, for example, $N_2$ gas when the lower layer is formed of a compound containing N and at least one element selected from the group consisting of Ti, Zr, Hf, V, Nb, Ta, Cr, Mo, W, Al, Si, and Y, and when the lower layer is formed of a compound containing N, C and at least one element selected from the group consisting of Ti, Zr, Hf, V, Nb, Ta, Cr, Mo, W, Al, Si, and Y, the gas is, for example, a mixed gas of $N_2$ gas and $C_2H_2$ gas. A volume ratio of the mixed gas is not particularly limited, and may be, for example, $N_2$ gas:$C_2H_2$ gas=95:5 to 85:15. Next, a bias voltage of −120 V to −30 V may be applied to the substrate, and the metal evaporation source corresponding to a metal component of each layer may be evaporated by an arc discharge of an arc current of 80 A to 150 A to form the lower layer.

When the A layer of the first alternately laminated structure and the second alternately laminated structure used in the present embodiment is formed, the temperature of the substrate is controlled to be 300° C. to 500° C., $N_2$ gas is introduced into the reaction vessel, and the pressure inside the reaction vessel is set to 3.0 Pa to 5.0 Pa. After that, it is preferable to apply a bias voltage of −80 V to −40 V to the substrate and to evaporate the metal evaporation source according to the metal component of the A layer by an arc discharge of 80 A to 150 A to thereby form the A layer.

When forming the B layer of the first alternately laminated structure and the C layer of the second alternately laminated structure used in the present embodiment, the temperature of the substrate is controlled to be 300° C. to 500° C. It is preferable to set the temperature of the substrate to the same temperature as the temperature of the substrate when the A layer is formed, because the A layer and the B layer, or the A layer and the C layer can be continuously formed. After controlling the temperature, $N_2$ gas is introduced into the reaction vessel, and the pressure inside the reaction vessel is set to 3.0 Pa to 5.0 Pa. Next, a bias voltage of −80 V to −40 V may be applied to the substrate, and the metal evaporation source corresponding to a metal component of the B layer or the C layer may be evaporated by an arc discharge of an arc current of 80 A to 150 A to form the B layer or the C layer.

In order to form a first alternately laminated structure in which two or more A layers and B layers are alternately laminated, the metal evaporation source corresponding to the metal component of the A layer and the metal evaporation source corresponding to the metal component of the B layer may be alternately evaporated under the above-described conditions by an arc discharge to form each layer alternately. By adjusting each arc discharge time of the metal evaporation source corresponding to the metal component of the A layer and the metal evaporation source corresponding to the metal component of the B layer, the thickness of each layer constituting the alternately laminated structure can be controlled.

The case where the second alternately laminated structure in which two or more A layers and two or more C layers are alternately laminated is formed is also the same as above.

In order to set the composition of the entire compound or the atomic ratios ((1−a−b)/d) and ((a+c)/2) in the alternately laminated structure used in the present embodiment to a predetermined value, the thickness of each layer in the alternately laminated structure and the ratio of the metal element in each layer may be adjusted in the aforementioned process of forming the alternately laminated structure.

In order to set the X-ray diffraction peak intensity ratio (I(111)/I(200)) in the coating layer used in the present embodiment to a predetermined value, the temperature of the substrate, the bias voltage, or the pressure inside the reaction vessel may be adjusted in the process of forming the aforementioned alternately laminated structure. More specifically, when the temperature of the substrate is lowered, the negative bias voltage is increased (in the direction away from zero), or the pressure inside the reaction vessel is lowered in the process of forming the alternately laminated structure, the X-ray diffraction peak intensity ratio (I(111)/I(200)) tends to be large.

When forming the upper layer used in the present embodiment, that the upper layer may be formed under the same manufacturing conditions as those of the lower layer described above. That is, first, the temperature of the substrate is controlled until the temperature thereof reaches 300° C. to 500° C. After controlling, gas is introduced into the reaction vessel to make the pressure in the reaction vessel to 3.0 Pa to 5.0 Pa. The gas is, for example, $N_2$ gas when the upper layer is formed of a compound containing N and at least one element selected from the group consisting of Ti, Zr, Hf, V, Nb, Ta, Cr, Mo, W, Al, Si, and Y, and when the upper layer is formed of a compound containing N, C and at least one element selected from the group consisting of Ti, Zr, Hf, V, Nb, Ta, Cr, Mo, W, Al, Si, and Y, the gas is, for example, a mixed gas of $N_2$ gas and $C_2H_2$ gas. A volume ratio of the mixed gas is not particularly limited, and may be, for example, $N_2$ gas:$C_2H_2$ gas=95:5 to 85:15. Next, a bias voltage of −120 V to −30 V may be applied to the substrate, and the metal evaporation source corresponding to a metal component of each layer may be evaporated by an arc discharge of an arc current of 80 A to 150 A to form the upper layer.

The thickness of each layer forming the coating layer in the coated cutting tool of the present embodiment is measured from a cross-sectional structure of the coated cutting tool using an optical microscope, a scanning electron microscope (SEM), a transmission electron microscope (TEM), or the like. The average thickness of each layer in the coated cutting tool of the present embodiment can be obtained by measuring the thickness of each layer from three or more cross sections in the vicinity of a position 50 μm from a cutting edge ridgeline portion of a surface facing the metal evaporation source toward a center portion of the surface and by calculating an average value (arithmetic mean value).

Further, the composition of each layer forming the coating layer in the coated cutting tool of the present embodiment can be measured from the cross-sectional structure of the coated cutting tool of the present embodiment by using an energy dispersive X-ray analyzer (EDS) or a wavelength dispersive X-ray analyzer (WDS).

It is considered that the coated cutting tool of the present embodiment has an effect that the tool life in both high-speed machining and high-feed machining can be extended as compared with that in the related art (however, the factors that can extend the tool life are not limited to the above). Specific examples of types of the coated cutting tool of the present embodiment include an indexable cutting insert for milling or turning, a drill, or an end mill.

EXAMPLES

Hereinafter, the invention will be described in more detail by way of Examples, but the present invention is not limited to these examples.

Example 1

As a substrate, a cemented carbide having a composition of 86.0% WC-12.0% Co-1.0% NbC-1.0% $Cr_3C_2$ (mass %) processed into an insert shape of SNMU1307ANEN-MJ (manufactured by Tungaloy Corporation) was prepared. A metal evaporation source was arranged in the reaction vessel of the arc ion plating device so as to obtain the composition of the compound layer shown in Tables 1 and 2. The prepared substrate was fixed to a fixing bracket of a rotary table in the reaction vessel.

After that, the inside of the reaction vessel was evacuated until the pressure reached a vacuum of $5.0\times10^{-3}$ Pa or less. After evacuation, the substrate was heated to 450° C. with a heater in the reaction vessel. After heating, Ar gas was introduced into the reaction vessel so that the pressure became 2.7 Pa.

In the Ar gas atmosphere with a pressure of 2.7 Pa, a bias voltage of −400 V was applied to the substrate, a current of 40 A was passed through the tungsten filament in the reaction vessel, and the surface of the substrate was subjected to ion bombardment treatment with Ar gas for 30 min. After the ion bombardment treatment was completed, the inside of the reaction vessel was evacuated until the pressure reached a vacuum of $5.0\times10^{-3}$ Pa or less.

For the invention samples 1 to 37 and the comparative samples 1 to 22, after vacuuming, the substrate was controlled so that the temperature thereof became such as shown in Tables 3 and 4 (the temperature at the start of film formation), nitrogen gas ($N_2$) was introduced into the reaction vessel, and the pressure inside the reaction vessel was adjusted to that shown in Tables 3 and 4. Then, the bias voltage shown in Tables 3 and 4 was applied to the substrate to alternately evaporate the metal evaporation sources of the A layer and the B layer having the composition shown in Tables 1 and 2 by the arc discharge of the arc current shown in Tables 3 and 4 in the order presented, and the A layer and the B layer were formed on the surface of the substrate in the order presented. At this time, the pressure in the reaction vessel was controlled to that shown in Tables 3 and 4. Further, the thicknesses of the A layer and the B layer were controlled by adjusting each arc discharge time so as to have the thicknesses shown in Tables 1 and 2.

After forming the compound layer on the surface of the substrate to the predetermined average thickness shown in Tables 1 and 2, the power of the heater was turned off, and after the sample temperature became 100° C. or lower, the sample was taken out from the reaction vessel.

An average thickness of each compound layer of the obtained sample was obtained by observing, using a TEM, three cross sections in the vicinity of a position 50 μm from a cutting edge ridgeline portion of a surface of the coated cutting tool facing the metal evaporation source toward a center portion of the surface, measuring the thickness of each layer, and calculating an average value (arithmetic mean value). The average thickness per layer of the A layer was calculated as a value obtained by dividing the total thickness which is the sum of the thicknesses of each A layer by the number of the A layers (number of repetitions). The average thickness per layer of the B layer was also calculated as a value obtained by dividing the total thickness which is the sum of the thicknesses of each B layer by the number of the B layers (number of repetitions) The results are shown in Tables 1 and 2.

The composition of each compound layer of the obtained sample was measured by using an EDS attached to the TEM in a cross section in the vicinity of the position 50 μm from the cutting edge ridgeline portion of the surface of the coated cutting tool facing the metal evaporation source toward the center portion. The results are also shown in Tables 1 and 2.

TABLE 1

| | Coating layer | | | | | | | | | | | | |
|---|---|---|---|---|---|---|---|---|---|---|---|---|---|
| | First alternately laminated structure | | | | | | | | | | | | Average thickness of entire coating layer (μm) |
| | Composition | | | | | | | | | | | | |
| | A layer, $(Al_aCr_bTi_{1-a-b})N$ | | | | B layer, $(Al_cTi_{1-c-d}B_d)N$ | | | | | | | | |
| Sample No. | a | b | 1 − a − b | Average thickness per layer (nm) | c | 1 − c − d | d | Average thickness per layer (nm) | (1 − a − b)/d | (a + c)/2 | Number of repetitions (times) | Average thickness (μm) | |
| Invention sample 1 | 0.65 | 0.1 | 0.24 | 50 | 0.49 | 0.46 | 0.05 | 50 | 4.8 | 0.570 | 30 | 3.00 | 3.00 |
| Invention sample 2 | 0.65 | 0.11 | 0.24 | 50 | 0.49 | 0.46 | 0.05 | 50 | 4.8 | 0.570 | 96 | 9.60 | 9.60 |
| Invention sample 3 | 0.65 | 0.11 | 0.24 | 50 | 0.49 | 0.46 | 0.05 | 50 | 4.8 | 0.570 | 78 | 7.80 | 7.80 |
| Invention sample 4 | 0.65 | 0.11 | 0.24 | 50 | 0.49 | 0.46 | 0.05 | 50 | 4.8 | 0.570 | 60 | 6.00 | 6.00 |
| Invention sample 5 | 0.65 | 0.11 | 0.24 | 50 | 0.49 | 0.46 | 0.05 | 50 | 4.8 | 0.570 | 21 | 2.10 | 2.10 |
| Invention sample 6 | 0.65 | 0.11 | 0.24 | 50 | 0.49 | 0.46 | 0.05 | 50 | 4.8 | 0.570 | 12 | 1.20 | 1.20 |
| Invention sample 7 | 0.65 | 0.11 | 0.24 | 50 | 0.49 | 0.46 | 0.05 | 50 | 4.8 | 0.570 | 6 | 0.60 | 0.60 |
| Invention sample 8 | 0.65 | 0.11 | 0.24 | 300 | 0.49 | 0.46 | 0.05 | 300 | 4.8 | 0.570 | 5 | 3.00 | 3.00 |
| Invention sample 9 | 0.65 | 0.11 | 0.24 | 150 | 0.49 | 0.46 | 0.05 | 150 | 4.8 | 0.570 | 10 | 3.00 | 3.00 |
| Invention sample 10 | 0.65 | 0.11 | 0.24 | 25 | 0.49 | 0.46 | 0.05 | 25 | 4.8 | 0.570 | 60 | 3.00 | 3.00 |
| Invention sample 11 | 0.65 | 0.11 | 0.24 | 3 | 0.49 | 0.46 | 0.05 | 3 | 4.8 | 0.570 | 500 | 3.00 | 3.00 |
| Invention sample 12 | 0.65 | 0.11 | 0.24 | 280 | 0.49 | 0.46 | 0.05 | 20 | 4.8 | 0.570 | 10 | 3.00 | 3.00 |
| Invention sample 13 | 0.65 | 0.11 | 0.24 | 20 | 0.49 | 0.46 | 0.05 | 280 | 4.8 | 0.570 | 10 | 3.00 | 3.00 |
| Invention sample 14 | 0.65 | 0.11 | 0.24 | 5 | 0.49 | 0.46 | 0.05 | 45 | 4.8 | 0.570 | 60 | 3.00 | 3.00 |
| Invention sample 15 | 0.65 | 0.11 | 0.24 | 45 | 0.49 | 0.46 | 0.05 | 5 | 4.8 | 0.570 | 60 | 3.00 | 3.00 |
| Invention sample 16 | 0.67 | 0.10 | 0.23 | 50 | 0.47 | 0.48 | 0.05 | 50 | 4.6 | 0.570 | 30 | 3.00 | 3.00 |
| Invention sample 17 | 0.51 | 0.18 | 0.31 | 50 | 0.63 | 0.32 | 0.05 | 50 | 6.2 | 0.570 | 30 | 3.00 | 3.00 |
| Invention sample 18 | 0.67 | 0.10 | 0.23 | 50 | 0.55 | 0.40 | 0.05 | 50 | 4.6 | 0.610 | 30 | 3.00 | 3.00 |
| Invention sample 19 | 0.51 | 0.25 | 0.24 | 50 | 0.51 | 0.44 | 0.05 | 50 | 4.8 | 0.510 | 30 | 3.00 | 3.00 |
| Invention sample 20 | 0.56 | 0.29 | 0.15 | 50 | 0.58 | 0.37 | 0.05 | 50 | 3.0 | 0.570 | 30 | 3.00 | 3.00 |
| Invention sample 21 | 0.67 | 0.03 | 0.30 | 50 | 0.47 | 0.48 | 0.05 | 50 | 6.0 | 0.570 | 30 | 3.00 | 3.00 |
| Invention sample 22 | 0.58 | 0.04 | 0.38 | 50 | 0.56 | 0.39 | 0.05 | 50 | 7.6 | 0.570 | 30 | 3.00 | 3.00 |
| Invention sample 23 | 0.67 | 0.21 | 0.12 | 50 | 0.47 | 0.48 | 0.05 | 50 | 2.4 | 0.570 | 30 | 3.00 | 3.00 |
| Invention sample 24 | 0.55 | 0.16 | 0.29 | 50 | 0.63 | 0.32 | 0.05 | 50 | 5.8 | 0.590 | 30 | 3.00 | 3.00 |
| Invention sample 25 | 0.65 | 0.11 | 0.24 | 50 | 0.33 | 0.65 | 0.02 | 50 | 12.0 | 0.490 | 30 | 3.00 | 3.00 |
| Invention sample 26 | 0.59 | 0.14 | 0.27 | 50 | 0.63 | 0.32 | 0.05 | 50 | 5.4 | 0.610 | 30 | 3.00 | 3.00 |
| Invention sample 27 | 0.61 | 0.13 | 0.26 | 50 | 0.31 | 0.67 | 0.02 | 50 | 13.0 | 0.460 | 30 | 3.00 | 3.00 |
| Invention sample 28 | 0.67 | 0.10 | 0.23 | 50 | 0.53 | 0.42 | 0.05 | 50 | 4.6 | 0.600 | 30 | 3.00 | 3.00 |
| Invention sample 29 | 0.61 | 0.13 | 0.26 | 50 | 0.47 | 0.48 | 0.05 | 50 | 5.2 | 0.540 | 30 | 3.00 | 3.00 |
| Invention sample 30 | 0.66 | 0.16 | 0.18 | 50 | 0.46 | 0.45 | 0.09 | 50 | 2.0 | 0.560 | 30 | 3.00 | 3.00 |
| Invention sample 31 | 0.65 | 0.14 | 0.21 | 50 | 0.47 | 0.46 | 0.07 | 50 | 3.0 | 0.560 | 30 | 3.00 | 3.00 |
| Invention sample 32 | 0.63 | 0.13 | 0.24 | 50 | 0.49 | 0.49 | 0.02 | 50 | 12.0 | 0.560 | 30 | 3.00 | 3.00 |
| Invention sample 33 | 0.62 | 0.14 | 0.24 | 50 | 0.50 | 0.49 | 0.01 | 50 | 24.0 | 0.560 | 30 | 3.00 | 3.00 |

TABLE 1-continued

| Sample No. | Coating layer: First alternately laminated structure: Composition: A layer, $(Al_aCr_bTi_{1-a-b})N$: a | b | 1 − a − b | Average thickness per layer (nm) | B layer, $(Al_cTi_{1-c-d}B_d)N$: c | 1 − c − d | d | Average thickness per layer (nm) | (1 − a − b)/d | (a + c)/2 | Number of repetitions (times) | Average thickness (μm) | Average thickness of entire coating layer (μm) |
|---|---|---|---|---|---|---|---|---|---|---|---|---|---|
| Invention sample 34 | 0.60 | 0.04 | 0.36 | 50 | 0.46 | 0.45 | 0.09 | 50 | 4.0 | 0.530 | 30 | 3.00 | 3.00 |
| Invention sample 35 | 0.65 | 0.23 | 0.12 | 50 | 0.49 | 0.49 | 0.02 | 50 | 6.0 | 0.570 | 30 | 3.00 | 3.00 |
| Invention sample 36 | 0.65 | 0.11 | 0.24 | 50 | 0.49 | 0.46 | 0.05 | 50 | 4.8 | 0.570 | 30 | 3.00 | 3.00 |
| Invention sample 37 | 0.65 | 0.11 | 0.24 | 50 | 0.49 | 0.46 | 0.05 | 50 | 4.8 | 0.570 | 30 | 3.00 | 3.00 |

TABLE 2

| Sample No. | Coating layer: First alternately laminated structure: Composition: A layer, $(Al_aCr_bTi_{1-a-b})N$: a | b | 1 − a − b | Average thickness per layer (nm) | B layer, $(Al_cTi_{1-c-d}B_d)N$: c | 1 − c − d | d | Others: Element | Others: Content | Average thickness per layer (nm) | (1 − a − b)/d | (a + c)/2 | Number of repetitions (times) | Average thickness (μm) | Average thickness of entire coating layer (μm) |
|---|---|---|---|---|---|---|---|---|---|---|---|---|---|---|---|
| Comparative sample 1 | 0.65 | 0.11 | 0.24 | 50 | 0.49 | 0.46 | 0.05 | — | — | 50 | 4.8 | 0.570 | 120 | 12.00 | 12.00 |
| Comparative sample 2 | 0.65 | 0.11 | 0.24 | 50 | 0.49 | 0.46 | 0.05 | — | — | 50 | 4.8 | 0.570 | 3 | 0.30 | 0.30 |
| Comparative sample 3 | 0.65 | 0.11 | 0.24 | 500 | 0.49 | 0.46 | 0.05 | — | — | 500 | 4.8 | 0.570 | 3 | 3.00 | 3.00 |
| Comparative sample 4 | 0.71 | 0.08 | 0.21 | 50 | 0.43 | 0.52 | 0.05 | — | — | 50 | 4.2 | 0.570 | 30 | 3.00 | 3.00 |
| Comparative sample 5 | 0.71 | 0.08 | 0.21 | 50 | 0.55 | 0.40 | 0.05 | — | — | 50 | 4.2 | 0.630 | 30 | 3.00 | 3.00 |
| Comparative sample 6 | 0.47 | 0.20 | 0.33 | 50 | 0.55 | 0.40 | 0.05 | — | — | 50 | 6.6 | 0.510 | 30 | 3.00 | 3.00 |
| Comparative sample 7 | 0.47 | 0.20 | 0.33 | 50 | 0.47 | 0.48 | 0.05 | — | — | 50 | 6.6 | 0.470 | 30 | 3.00 | 3.00 |
| Comparative sample 8 | 0.53 | 0.35 | 0.12 | 50 | 0.61 | 0.34 | 0.05 | — | — | 50 | 2.4 | 0.570 | 30 | 3.00 | 3.00 |
| Comparative sample 9 | 0.67 | 0.00 | 0.33 | 50 | 0.47 | 0.48 | 0.05 | — | — | 50 | 6.6 | 0.570 | 30 | 3.00 | 3.00 |
| Comparative sample 10 | 0.56 | 0.02 | 0.42 | 50 | 0.58 | 0.37 | 0.05 | — | — | 50 | 8.4 | 0.570 | 30 | 3.00 | 3.00 |
| Comparative sample 11 | 0.67 | 0.27 | 0.06 | 50 | 0.47 | 0.52 | 0.01 | — | — | 50 | 6.0 | 0.570 | 30 | 3.00 | 3.00 |
| Comparative sample 12 | 0.57 | 0.19 | 0.24 | 50 | 0.65 | 0.30 | 0.05 | — | — | 50 | 4.8 | 0.610 | 30 | 3.00 | 3.00 |
| Comparative sample 13 | 0.65 | 0.11 | 0.24 | 50 | 0.29 | 0.69 | 0.02 | — | — | 50 | 12.0 | 0.470 | 30 | 3.00 | 3.00 |
| Comparative sample 14 | 0.61 | 0.13 | 0.26 | 50 | 0.65 | 0.32 | 0.03 | — | — | 50 | 8.7 | 0.630 | 30 | 3.00 | 3.00 |
| Comparative sample 15 | 0.61 | 0.13 | 0.26 | 50 | 0.27 | 0.71 | 0.02 | — | — | 50 | 13.0 | 0.440 | 30 | 3.00 | 3.00 |
| Comparative sample 16 | 0.65 | 0.05 | 0.30 | 50 | 0.49 | 0.39 | 0.12 | — | — | 50 | 2.5 | 0.570 | 30 | 3.00 | 3.00 |
| Comparative sample 17 | 0.65 | 0.17 | 0.18 | 50 | 0.49 | 0.39 | 0.12 | — | — | 50 | 1.5 | 0.570 | 30 | 3.00 | 3.00 |
| Comparative sample 18 | 0.65 | 0.11 | 0.24 | 50 | 0.49 | 0.51 | 0.00 | — | — | 50 | — | 0.570 | 30 | 3.00 | 3.00 |
| Comparative sample 19 | 0.65 | 0.05 | 0.30 | 50 | 0.49 | 0.39 | 0.12 | — | — | 50 | 2.5 | 0.570 | 30 | 3.00 | 3.00 |

TABLE 2-continued

| Sample No. | Coating layer: First alternately laminated structure: Composition: A layer, $(Al_aCr_bTi_{1-a-b})N$: a | b | 1 − a − b | Average thickness per layer (nm) | B layer, $(Al_cTi_{1-c-d}B_d)N$: c | 1 − c − d | d | Others: Element | Others: Content | Average thickness per layer (nm) | (1 − a − b)/d | (a + c)/2 | Number of repetitions (times) | Average thickness (μm) | Average thickness of entire coating layer (μm) |
|---|---|---|---|---|---|---|---|---|---|---|---|---|---|---|---|
| Comparative sample 20 | 0.65 | 0.11 | 0.24 | 50 | 0.49 | 0.51 | 0.00 | — | — | 50 | — | 0.570 | 30 | 3.00 | 3.00 |
| Comparative sample 21 | 0.65 | 0.11 | 0.24 | 50 | 0.49 | 0.38 | 0.05 | Cr | 0.08 | 50 | 4.8 | 0.570 | 30 | 3.00 | 3.00 |
| Comparative sample 22 | 0.65 | 0.11 | 0.24 | 50 | 0.49 | 0.31 | 0.05 | Cr | 0.15 | 50 | 4.8 | 0.570 | 30 | 3.00 | 3.00 |

TABLE 3

| Sample No. | A layer: Temperature (° C.) | A layer: Voltage (V) | A layer: Current (A) | A layer: Pressure (Pa) | B layer: Temperature (° C.) | B layer: Voltage (V) | B layer: Current (A) | B layer: Pressure (Pa) |
|---|---|---|---|---|---|---|---|---|
| Invention sample 1 | 500 | −60 | 120 | 3.0 | 500 | −60 | 120 | 3.0 |
| Invention sample 2 | 500 | −40 | 120 | 3.0 | 500 | −40 | 120 | 3.0 |
| Invention sample 3 | 500 | −60 | 120 | 3.0 | 500 | −60 | 120 | 3.0 |
| Invention sample 4 | 500 | −80 | 120 | 3.0 | 500 | −80 | 120 | 3.0 |
| Invention sample 5 | 500 | −60 | 120 | 3.0 | 500 | −60 | 120 | 3.0 |
| Invention sample 6 | 400 | −80 | 120 | 3.0 | 400 | −80 | 120 | 3.0 |
| Invention sample 7 | 500 | −60 | 120 | 3.0 | 500 | −60 | 120 | 3.0 |
| Invention sample 8 | 500 | −60 | 150 | 3.0 | 500 | −60 | 150 | 3.0 |
| Invention sample 9 | 500 | −60 | 120 | 3.0 | 500 | −60 | 120 | 3.0 |
| Invention sample 10 | 500 | −60 | 120 | 3.0 | 500 | −60 | 120 | 3.0 |
| Invention sample 11 | 500 | −60 | 80 | 3.0 | 500 | −60 | 80 | 3.0 |
| Invention sample 12 | 500 | −60 | 150 | 3.0 | 500 | −60 | 100 | 3.0 |
| Invention sample 13 | 500 | −60 | 100 | 3.0 | 500 | −60 | 150 | 3.0 |
| Invention sample 14 | 400 | −60 | 120 | 3.0 | 400 | −60 | 120 | 3.0 |
| Invention sample 15 | 500 | −40 | 120 | 4.0 | 500 | −40 | 120 | 4.0 |
| Invention sample 16 | 500 | −60 | 120 | 3.0 | 500 | −60 | 120 | 3.0 |
| Invention sample 17 | 500 | −60 | 120 | 3.0 | 500 | −60 | 120 | 3.0 |
| Invention sample 18 | 500 | −60 | 120 | 3.0 | 500 | −60 | 120 | 3.0 |
| Invention sample 19 | 500 | −60 | 120 | 3.0 | 500 | −60 | 120 | 3.0 |
| Invention sample 20 | 500 | −60 | 120 | 3.0 | 500 | −60 | 120 | 3.0 |
| Invention sample 21 | 500 | −60 | 120 | 3.0 | 500 | −60 | 120 | 3.0 |
| Invention sample 22 | 500 | −60 | 120 | 3.0 | 500 | −60 | 120 | 3.0 |
| Invention sample 23 | 500 | −60 | 120 | 3.0 | 500 | −60 | 120 | 3.0 |
| Invention sample 24 | 500 | −60 | 120 | 3.0 | 500 | −60 | 120 | 3.0 |
| Invention sample 25 | 500 | −60 | 120 | 3.0 | 500 | −60 | 120 | 3.0 |
| Invention sample 26 | 500 | −60 | 120 | 3.0 | 500 | −60 | 120 | 3.0 |
| Invention sample 27 | 500 | −60 | 120 | 3.0 | 500 | −60 | 120 | 3.0 |
| Invention sample 28 | 500 | −60 | 120 | 3.0 | 500 | −60 | 120 | 3.0 |
| Invention sample 29 | 500 | −60 | 120 | 3.0 | 500 | −60 | 120 | 3.0 |
| Invention sample 30 | 500 | −60 | 120 | 3.0 | 500 | −60 | 120 | 3.0 |
| Invention sample 31 | 500 | −60 | 120 | 3.0 | 500 | −60 | 120 | 3.0 |
| Invention sample 32 | 500 | −60 | 120 | 3.0 | 500 | −60 | 120 | 3.0 |
| Invention sample 33 | 500 | −60 | 120 | 3.0 | 500 | −60 | 120 | 3.0 |
| Invention sample 34 | 500 | −60 | 120 | 3.0 | 500 | −60 | 120 | 3.0 |
| Invention sample 35 | 500 | −60 | 120 | 3.0 | 500 | −60 | 120 | 3.0 |
| Invention sample 36 | 500 | −40 | 120 | 5.0 | 500 | −40 | 120 | 5.0 |
| Invention sample 37 | 300 | −80 | 120 | 3.0 | 300 | −80 | 120 | 3.0 |

TABLE 4

| | A layer | | | | B layer | | | |
|---|---|---|---|---|---|---|---|---|
| Sample No. | Temperature (° C.) | Voltage (V) | Current (A) | Pressure (Pa) | Temperature (° C.) | Voltage (V) | Current (A) | Pressure (Pa) |
| Comparative sample 1 | 500 | −60 | 120 | 3.0 | 500 | −60 | 120 | 3.0 |
| Comparative sample 2 | 500 | −60 | 120 | 3.0 | 500 | −60 | 120 | 3.0 |
| Comparative sample 3 | 500 | −60 | 150 | 3.0 | 500 | −60 | 150 | 3.0 |
| Comparative sample 4 | 500 | −60 | 120 | 3.0 | 500 | −60 | 120 | 3.0 |
| Comparative sample 5 | 500 | −60 | 120 | 3.0 | 500 | −60 | 120 | 3.0 |
| Comparative sample 6 | 500 | −60 | 120 | 3.0 | 500 | −60 | 120 | 3.0 |
| Comparative sample 7 | 500 | −60 | 120 | 3.0 | 500 | −60 | 120 | 3.0 |
| Comparative sample 8 | 500 | −60 | 120 | 3.0 | 500 | −60 | 120 | 3.0 |
| Comparative sample 9 | 500 | −60 | 120 | 3.0 | 500 | −60 | 120 | 3.0 |
| Comparative sample 10 | 500 | −60 | 120 | 3.0 | 500 | −60 | 120 | 3.0 |
| Comparative sample 11 | 500 | −60 | 120 | 3.0 | 500 | −60 | 120 | 3.0 |
| Comparative sample 12 | 500 | −60 | 120 | 3.0 | 500 | −60 | 120 | 3.0 |
| Comparative sample 13 | 500 | −60 | 120 | 3.0 | 500 | −60 | 120 | 3.0 |
| Comparative sample 14 | 500 | −60 | 120 | 3.0 | 500 | −60 | 120 | 3.0 |
| Comparative sample 15 | 500 | −60 | 120 | 3.0 | 500 | −60 | 120 | 3.0 |
| Comparative sample 16 | 500 | −60 | 120 | 3.0 | 500 | −60 | 120 | 3.0 |
| Comparative sample 17 | 500 | −60 | 120 | 3.0 | 500 | −60 | 120 | 3.0 |
| Comparative sample 18 | 500 | −60 | 120 | 3.0 | 500 | −60 | 120 | 3.0 |
| Comparative sample 19 | 600 | −40 | 120 | 5.0 | 600 | −40 | 120 | 5.0 |
| Comparative sample 20 | 300 | −80 | 120 | 3.0 | 300 | −80 | 120 | 3.0 |
| Comparative sample 21 | 500 | −60 | 100 | 3.0 | 500 | −60 | 120 | 3.0 |
| Comparative sample 22 | 500 | −60 | 100 | 3.0 | 500 | −60 | 120 | 3.0 |

The ratio (I(111)/I(200)) of the diffraction peak intensity (I(111)) of the cubic crystal (111) plane to the diffraction peak intensity (I(200)) of the cubic crystal (200) plane in the alternately laminated structure of the obtained sample was measured by using an X-ray diffractometer, model name: SmartLab manufactured by Rigaku Corporation. Specifically, the ratio (I(111)/I(200)) was calculated by measuring the peak intensity (I(200)) of the cubic crystal (200) plane of the alternately laminated structure and the peak intensity (I(111)) of the cubic crystal (111) plane of the alternately laminated structure by X-ray diffraction measurement with a 2θ/θ focused optical system using Cu-Kα rays under the conditions of output: 45 kV, 200 mA, incident side solar slit: 5°, divergent vertical slit: ⅔°, divergent vertical limiting slit: 5 mm, scattering slit: 8 mm, light receiving side solar slit: 5°, light receiving slit: 0.3 mm, sampling width: 0.02°, scan speed: 1°/min, and 2θ measurement range: 30° to 90°. The results are shown in Tables 5 and 6. When obtaining the above peak intensity of each plane index from the X-ray diffraction pattern, the analysis software provided with the X-ray diffractometer was used. In the analysis software, each peak intensity was obtained by performing background processing and Kα2 peak removal using a cubic approximation, and performing profile fitting using the Pearson-VII function. Further, the crystal system of the alternately laminated structure was also confirmed by X-ray diffraction measurement. More specifically, the peak intensities of the cubic crystal (200) plane and the cubic crystal (111) plane of the alternately laminated structure were measured as the measurement objects. At this time, the peaks of the A layer and the peaks of the B layer were not separated, and the peak intensity including both reflections was obtained. For convenience, the above ratio (I(111)/I(200)) was calculated from the peak intensities thus obtained.

TABLE 5

| Sample No. | First alternately laminated structure I(111)/I(200) |
|---|---|
| Invention sample 1 | 3.0 |
| Invention sample 2 | 2.6 |
| Invention sample 3 | 3.2 |
| Invention sample 4 | 3.6 |
| Invention sample 5 | 2.9 |
| Invention sample 6 | 4.5 |
| Invention sample 7 | 3.1 |

TABLE 5-continued

| Sample No. | First alternately laminated structure I(111)/I(200) |
|---|---|
| Invention sample 8 | 3.2 |
| Invention sample 9 | 3.1 |
| Invention sample 10 | 2.8 |
| Invention sample 11 | 2.9 |
| Invention sample 12 | 3.0 |
| Invention sample 13 | 3.0 |
| Invention sample 14 | 4.0 |
| Invention sample 15 | 1.8 |
| Invention sample 16 | 3.2 |
| Invention sample 17 | 2.9 |
| Invention sample 18 | 3.1 |
| Invention sample 19 | 2.9 |
| Invention sample 20 | 3.2 |
| Invention sample 21 | 3.0 |
| Invention sample 22 | 2.8 |
| Invention sample 23 | 3.1 |
| Invention sample 24 | 3.1 |
| Invention sample 25 | 2.9 |
| Invention sample 26 | 3.1 |
| Invention sample 27 | 3.0 |
| Invention sample 28 | 3.0 |
| Invention sample 29 | 3.0 |
| Invention sample 30 | 3.2 |
| Invention sample 31 | 3.2 |
| Invention sample 32 | 3.1 |
| Invention sample 33 | 3.1 |
| Invention sample 34 | 3.2 |
| Invention sample 35 | 3.0 |
| Invention sample 36 | 1.1 |
| Invention sample 37 | 4.8 |

TABLE 6

| Sample No. | First alternately laminated structure I(111)/I(200) |
|---|---|
| Comparative sample 1 | 3.3 |
| Comparative sample 2 | 2.7 |
| Comparative sample 3 | 2.9 |
| Comparative sample 4 | 3.1 |
| Comparative sample 5 | 3.2 |
| Comparative sample 6 | 3.0 |
| Comparative sample 7 | 3.0 |
| Comparative sample 8 | 3.0 |
| Comparative sample 9 | 3.1 |
| Comparative sample 10 | 3.0 |
| Comparative sample 11 | 2.9 |
| Comparative sample 12 | 3.1 |
| Comparative sample 13 | 2.9 |
| Comparative sample 14 | 3.1 |
| Comparative sample 15 | 3.2 |
| Comparative sample 16 | 3.2 |
| Comparative sample 17 | 3.2 |
| Comparative sample 18 | 3.1 |
| Comparative sample 19 | 0.4 |
| Comparative sample 20 | 5.6 |

TABLE 6-continued

| Sample No. | First alternately laminated structure I(111)/I(200) |
|---|---|
| Comparative sample 21 | 3.0 |
| Comparative sample 22 | 3.1 |

By using the obtained samples, the following cutting test was performed, and the results thereof were evaluated.

Cutting Test (Cutting Test Conditions 1) High-Speed Machining

Work material: SUS304,

Work material shape: a plate of 200 mm×150 mm×70 mm,

Cutting speed: 250 m/min,

Feed: 0.1 mm/tooth,

Depth of cut: 2.0 mm,

Width of cut: 70 mm,

Coolant: no use,

Evaluation items: the machining time until the flank wear width of the tool reached 0.3 mm or the cutting edge was fractured was taken as the tool life. It means that the longer the machining time until the tool life is, the more excellent the fracture resistance and the wear resistance are.

The results of the obtained evaluation are shown in Tables 7 and 8. In Tables 7 and 8, as for the tool life in the cutting test conditions 1, 30 minutes or more was shown as the evaluation “A”, 20 minutes or more and less than 30 minutes was shown as the evaluation “B”, and less than 20 minutes was shown as the evaluation “C”. In Tables 7 and 8, as for the “damage”, the case where the flank wear width reached 0.3 mm and the tool life was thus ended was shown as “normal wear”, and the case where the cutting edge was fractured and the tool life was thus ended was shown as “fracture”.

(Cutting Test Conditions 2) High-Feed Machining

Work material: SCM440,

Work material shape: a plate of 200 mm×150 mm×25 mm,

Cutting speed: 150 m/min,

Feed: 0.3 mm/tooth,

Depth of cut: 2.0 mm,

Width of cut: 25 mm,

Coolant: use

Evaluation items: the machining time until the cutting edge was fractured was taken as the tool life. It means that the longer the machining time until the tool life is, the more excellent the fracture resistance and the wear resistance are.

The results of the obtained evaluation are shown in Tables 7 and 8. In Tables 7 and 8, as for the tool life in the cutting test conditions 2, 25 minutes or more was shown as the evaluation “A”, 20 minutes or more and less than 25 minutes was shown as the evaluation “B”, and less than 20 minutes was shown as the evaluation “C”.

TABLE 7

| | Cutting test conditions 1 | | | Cutting test conditions 2 | |
|---|---|---|---|---|---|
| Sample No. | Damage | Tool life (min) | Evaluation | Tool life (min) | Evaluation |
| Invention sample 1 | Normal wear | 32.6 | A | 27.2 | A |
| Invention sample 2 | Normal wear | 35.0 | A | 21.5 | B |
| Invention sample 3 | Normal wear | 34.8 | A | 23.6 | B |
| Invention sample 4 | Normal wear | 34.5 | A | 24.8 | B |
| Invention sample 5 | Normal wear | 30.3 | A | 27.8 | A |
| Invention sample 6 | Normal wear | 27.8 | B | 27.1 | A |
| Invention sample 7 | Normal wear | 22.8 | B | 24.4 | B |

TABLE 7-continued

| Sample No. | Damage | Cutting test conditions 1 Tool life (min) | Cutting test conditions 1 Evaluation | Cutting test conditions 2 Tool life (min) | Cutting test conditions 2 Evaluation |
|---|---|---|---|---|---|
| Invention sample 8 | Normal wear | 26.8 | B | 23.2 | B |
| Invention sample 9 | Normal wear | 29.7 | B | 25.5 | A |
| Invention sample 10 | Normal wear | 32.4 | A | 26.8 | A |
| Invention sample 11 | Normal wear | 32.5 | A | 25.7 | A |
| Invention sample 12 | Normal wear | 30.4 | A | 24.3 | B |
| Invention sample 13 | Normal wear | 28.9 | B | 25.1 | A |
| Invention sample 14 | Normal wear | 33.1 | A | 26.1 | A |
| Invention sample 15 | Normal wear | 31.9 | A | 27.5 | A |
| Invention sample 16 | Normal wear | 28.9 | B | 26.4 | A |
| Invention sample 17 | Normal wear | 27.6 | B | 25.7 | A |
| Invention sample 18 | Normal wear | 30.7 | A | 26.5 | A |
| Invention sample 19 | Normal wear | 25.3 | B | 23.9 | B |
| Invention sample 20 | Normal wear | 32.3 | A | 22.0 | B |
| Invention sample 21 | Normal wear | 30.7 | A | 29.4 | A |
| Invention sample 22 | Normal wear | 31.9 | A | 31.0 | A |
| Invention sample 23 | Normal wear | 30.4 | A | 22.1 | B |
| Invention sample 24 | Normal wear | 32.5 | A | 26.3 | A |
| Invention sample 25 | Normal wear | 27.7 | B | 26.7 | A |
| Invention sample 26 | Normal wear | 29.1 | B | 26.5 | A |
| Invention sample 27 | Normal wear | 22.6 | B | 26.6 | A |
| Invention sample 28 | Normal wear | 30.4 | A | 26.6 | A |
| Invention sample 29 | Normal wear | 30.2 | A | 26.6 | A |
| Invention sample 30 | Normal wear | 33.7 | A | 22.1 | B |
| Invention sample 31 | Normal wear | 33.3 | A | 23.8 | B |
| Invention sample 32 | Normal wear | 30.3 | A | 31.1 | A |
| Invention sample 33 | Normal wear | 29.3 | B | 32.2 | A |
| Invention sample 34 | Normal wear | 33.6 | A | 26.4 | A |
| Invention sample 35 | Normal wear | 31.6 | A | 29.6 | A |
| Invention sample 36 | Normal wear | 30.7 | A | 28.5 | A |
| Invention sample 37 | Normal wear | 34.4 | A | 24.8 | B |

TABLE 8

| Sample No. | Damage | Cutting test conditions 1 Tool life (min) | Cutting test conditions 1 Evaluation | Cutting test conditions 2 Tool life (min) | Cutting test conditions 2 Evaluation |
|---|---|---|---|---|---|
| Comparative sample 1 | Fracture | 11.9 | C | 13.3 | C |
| Comparative sample 2 | Normal wear | 13.6 | C | 20.2 | B |
| Comparative sample 3 | Fracture | 17.5 | C | 16.7 | C |
| Comparative sample 4 | Fracture | 18.1 | C | 22.5 | B |
| Comparative sample 5 | Fracture | 14.4 | C | 22.4 | B |
| Comparative sample 6 | Normal wear | 19.1 | C | 21.6 | B |
| Comparative sample 7 | Normal wear | 17.8 | C | 20.8 | B |
| Comparative sample 8 | Fracture | 15.9 | C | 15.4 | C |
| Comparative sample 9 | Fracture | 16.8 | C | 26.1 | A |
| Comparative sample 10 | Normal wear | 18.9 | C | 24.6 | B |
| Comparative sample 11 | Fracture | 12.7 | C | 22.0 | B |
| Comparative sample 12 | Fracture | 18.0 | C | 21.7 | B |
| Comparative sample 13 | Fracture | 15.9 | C | 24.7 | B |
| Comparative sample 14 | Fracture | 13.7 | C | 26.7 | A |
| Comparative sample 15 | Fracture | 14.2 | C | 25.6 | A |
| Comparative sample 16 | Fracture | 17.7 | C | 12.5 | C |

TABLE 8-continued

| | Cutting test conditions 1 | | | Cutting test conditions 2 | |
|---|---|---|---|---|---|
| Sample No. | Damage | Tool life (min) | Evaluation | Tool life (min) | Evaluation |
| Comparative sample 17 | Fracture | 14.8 | C | 9.1 | C |
| Comparative sample 18 | Fracture | 12.7 | C | 24.7 | B |
| Comparative sample 19 | Fracture | 17.9 | C | 16.5 | C |
| Comparative sample 20 | Fracture | 13.2 | C | 19.6 | C |
| Comparative sample 21 | Fracture | 17.6 | C | 18.6 | C |
| Comparative sample 22 | Fracture | 11.6 | C | 17.0 | C |

It was found from the results shown in Tables 7 and 8 that the invention samples had an evaluation of "B" or more in both cutting test conditions 1 and cutting test conditions 2, no evaluation "C", more excellent fracture resistance and wear resistance than the comparative samples, and a long tool life.

Example 2

As a substrate, a cemented carbide having a composition of 86.0% WC-12.0% Co-1.0% NbC-1.0% $Cr_3C_2$ (mass %) processed into an insert shape of SNMU1307ANEN-MJ (manufactured by Tungaloy Corporation) was prepared. A predetermined metal evaporation source was arranged in the reaction vessel of the arc ion plating device. The prepared substrate was fixed to a fixing bracket of a rotary table in the reaction vessel.

After that, the inside of the reaction vessel was evacuated until the pressure reached a vacuum of $5.0\times10^{-3}$ Pa or less. After evacuation, the substrate was heated to 450° C. with a heater in the reaction vessel. After heating, Ar gas was introduced into the reaction vessel so that the pressure became 2.7 Pa.

In the Ar gas atmosphere with a pressure of 2.7 Pa, a bias voltage of −400 V was applied to the substrate, a current of 40 A was passed through the tungsten filament in the reaction vessel, and the surface of the substrate was subjected to ion bombardment treatment with Ar gas for 30 min. After the ion bombardment treatment was completed, the inside of the reaction vessel was evacuated until the pressure reached a vacuum of $5.0\times10^{-3}$ Pa or less.

After evacuation, as shown in Tables 9 and 10, the first alternately laminated structure and the second alternately laminated structure are alternately formed on the surface of the substrate. The manufacturing conditions of the first alternately laminated structure were the same as the manufacturing conditions of each of the invention samples shown in the column of the "composition" in Tables 9 and 10. However, the average thickness per layer of each layer, the number of repetitions and average thickness per structure, and the total average thickness were as shown in Tables 9 and 10. Further, the second alternately laminated structures (Types A to G) were manufactured according to the compositions shown in Table 11 and the manufacturing conditions shown in Table 12 as follows. After vacuuming, the substrate was controlled until the temperature of the substrate became the temperature shown in Table 12 (the temperature at the start of film formation), nitrogen gas ($N_2$) was introduced into the reaction vessel, and the pressure inside the reaction vessel was adjusted to that shown in Table 12. Then, the bias voltage shown in Table 12 was applied to the substrate to evaporate the metal evaporation source of the A layer and the C layer having the composition shown in Table 11 by the arc discharge of the arc current shown in Table 12 to form the A layer and the C layer on the predetermined surface in the order presented. At this time, the pressure in the reaction vessel was controlled to that shown in Table 12. Further, the thicknesses of the A layer and the C layer were controlled by adjusting each arc discharge time so as to have the thicknesses shown in Tables 9 and 10.

Basically, the invention samples were formed in the order of the first alternately laminated structure/the second alternately laminated structure/the first alternately laminated structure/the second alternately laminated structure from the substrate side, but the invention samples 44, 54, and 55 having "*" after the number in the column of "number of repetitions" in Table 10 were formed in the order of the second alternately laminated structure/the first alternately laminated structure/the second alternately laminated structure/the first alternately laminated structure from the substrate. The invention samples 43 to 65 shown in Table 10 had the third alternately laminated structure in which the first alternately laminated structure and the second alternately laminated structure were alternately formed three or more times in total (the number of repetitions was 1.5 or more).

After forming each predetermined coating layer shown in Tables 9 and 10 on the surface of the substrate, the power of the heater was turned off, and after the sample temperature became 100° C. or less, the sample was taken out from the reaction vessel.

The average thickness and composition of each layer of the obtained samples were measured and calculated in the same manner as in Example 1. The results are shown in Tables 1 and 11. Further, the ratio (I(111)/I(200)) of the diffraction peak intensity (I(111)) of the cubic crystal (111) plane to the diffraction peak intensity (I(200)) of the cubic crystal (200) plane in the alternately laminated structure of the obtained samples was measured and calculated in the same manner as in Example 1. The results are shown in Table 13. In the present Examples, since the peak of the first alternately laminated structure and the peak of the second alternately laminated structure were overlapped, the peaks were not separated, and the peak intensity including both reflections was obtained.

TABLE 9

| | Coating layer | | | | | | | | | | | |
|---|---|---|---|---|---|---|---|---|---|---|---|---|
| | First alternately laminated structure | | | | | Second alternately laminated structure | | | | | | Average |
| Sample No. | Composition | Average thickness per layer of A layer (nm) | Average thickness per layer of B layer (nm) | Number of repetitions (times) | Average thickness (μm) | Composition | Average thickness per layer of A layer (nm) | Average thickness per layer of C layer (nm) | Number of repetitions (times) | Average thickness (μm) | Number of repetitions (times) | thickness of entire coating layer (μm) |
| Invention sample 38 | Same as Invention sample 1 | 50 | 50 | 20 | 2.00 | Same as type A | 10 | 10 | 50 | 1.00 | 1 | 3.00 |
| Invention sample 39 | Same as Invention sample 1 | 25 | 75 | 20 | 2.00 | Same as type B | 10 | 10 | 50 | 1.00 | 1 | 3.00 |
| Invention sample 40 | Same as Invention sample 1 | 50 | 50 | 20 | 2.00 | Same as type C | 10 | 10 | 50 | 1.00 | 1 | 3.00 |
| Invention sample 41 | Same as Invention sample 1 | 50 | 50 | 20 | 2.00 | Same as type A | 25 | 25 | 20 | 1.00 | 1 | 3.00 |
| Invention sample 42 | Same as Invention sample 1 | 50 | 50 | 20 | 2.00 | Same as type A | 2 | 2 | 250 | 1.00 | 1 | 3.00 |

TABLE 10

| | Coating layer | | | | | | |
|---|---|---|---|---|---|---|---|
| | Third alternately laminated structure | | | | | | |
| | First alternately laminated structure | | | | | Second alternately laminated structure | |
| Sample No. | Composition | Average thickness per layer of A layer (nm) | Average thickness per layer of B layer (nm) | Number of repetitions per structure (times) | Average thickness per structure (μm) | Total average thickness (μm) | Composition | Average thickness per layer of A layer (nm) |
| Invention sample 43 | Same as Invention sample 1 | 50 | 50 | 12 | 1.20 | 2.40 | Same as type A | 10 |
| Invention sample 44 | Same as Invention sample 1 | 50 | 50 | 20 | 2.00 | 2.00 | Same as type A | 10 |
| Invention sample 45 | Same as Invention sample 1 | 50 | 50 | 5 | 0.50 | 1.50 | Same as type A | 10 |
| Invention sample 46 | Same as Invention sample 1 | 50 | 50 | 5 | 0.50 | 1.50 | Same as type D | 10 |
| Invention sample 47 | Same as Invention sample 1 | 50 | 50 | 5 | 0.50 | 1.50 | Same as type E | 10 |
| Invention sample 48 | Same as Invention sample 1 | 50 | 50 | 5 | 0.50 | 1.50 | Same as type F | 10 |
| Invention sample 49 | Same as Invention sample 1 | 50 | 50 | 5 | 0.50 | 1.50 | Same as type G | 10 |
| Invention sample 50 | Same as Invention sample 36 | 70 | 30 | 5 | 0.50 | 1.50 | Same as type A | 4 |
| Invention sample 51 | Same as Invention sample 37 | 30 | 70 | 2 | 0.20 | 0.60 | Same as type A | 21 |
| Invention sample 52 | Same as Invention sample 18 | 50 | 50 | 5 | 0.50 | 1.50 | Same as type C | 5 |
| Invention sample 53 | Same as Invention sample 19 | 70 | 30 | 5 | 0.50 | 1.50 | Same as type B | 10 |
| Invention sample 54 | Same as Invention sample 22 | 100 | 100 | 5 | 1.00 | 2.00 | Same as type B | 27 |

TABLE 10-continued

| | | | | | | | | |
|---|---|---|---|---|---|---|---|---|
| Invention sample 55 | Same as Invention sample 23 | 250 | 250 | 2 | 1.00 | 2.00 | Same as type C | 3 |
| Invention sample 56 | Same as Invention sample 24 | 50 | 150 | 4 | 0.80 | 2.40 | Same as type G | 25 |
| Invention sample 57 | Same as Invention sample 25 | 150 | 50 | 4 | 0.80 | 2.40 | Same as type E | 5 |
| Invention sample 58 | Same as Invention sample 30 | 50 | 50 | 5 | 0.50 | 1.50 | Same as type B | 10 |
| Invention sample 59 | Same as Invention sample 33 | 150 | 100 | 2 | 0.50 | 1.50 | Same as type C | 25 |
| Invention sample 60 | Same as Invention sample 1 | 50 | 50 | 5 | 0.50 | 4.50 | Same as type A | 10 |
| Invention sample 61 | Same as Invention sample 1 | 30 | 30 | 2 | 0.12 | 5.40 | Same as type A | 10 |
| Invention sample 62 | Same as Invention sample 1 | 30 | 30 | 25 | 1.50 | 3.00 | Same as type A | 50 |
| Invention sample 63 | Same as Invention sample 1 | 10 | 10 | 75 | 1.50 | 3.00 | Same as type A | 10 |
| Invention sample 64 | Same as Invention sample 1 | 30 | 30 | 25 | 1.50 | 3.00 | Same as type A | 10 |
| Invention sample 65 | Same as Invention sample 1 | 250 | 250 | 3 | 1.50 | 3.00 | Same as type A | 10 |

| | Coating layer | | | | | |
|---|---|---|---|---|---|---|
| | Third alternately laminated structure | | | | | |
| | Second alternately laminated structure | | | | | |
| Sample No. | Average thickness per layer of C layer (nm) | Number of repetitions per structure (times) | Average thickness per structure (μm) | Total average thickness (μm) | Number of repetitions (times) | Average thickness of entire coating layer (μm) |
| Invention sample 43 | 10 | 30 | 0.60 | 0.60 | 1.5 | 3.00 |
| Invention sample 44 | 10 | 25 | 0.50 | 1.00 | 1.5* | 3.00 |
| Invention sample 45 | 10 | 25 | 0.50 | 1.50 | 3 | 3.00 |
| Invention sample 46 | 10 | 25 | 0.50 | 1.50 | 3 | 3.00 |
| Invention sample 47 | 10 | 25 | 0.50 | 1.50 | 3 | 3.00 |
| Invention sample 48 | 10 | 25 | 0.50 | 1.50 | 3 | 3.00 |
| Invention sample 49 | 10 | 25 | 0.50 | 1.50 | 3 | 3.00 |
| Invention sample 50 | 21 | 20 | 0.50 | 1.50 | 3 | 3.00 |
| Invention sample 51 | 4 | 8 | 0.20 | 0.60 | 3 | 1.20 |
| Invention sample 52 | 5 | 50 | 0.50 | 1.50 | 3 | 3.00 |
| Invention sample 53 | 10 | 25 | 0.50 | 1.50 | 3 | 3.00 |
| Invention sample 54 | 3 | 20 | 0.60 | 1.80 | 2.5* | 3.80 |
| Invention sample 55 | 27 | 20 | 0.60 | 1.80 | 2.5* | 3.80 |
| Invention sample 56 | 25 | 6 | 0.30 | 0.60 | 2.5 | 3.00 |
| Invention sample 57 | 5 | 30 | 0.30 | 0.60 | 2.5 | 3.00 |
| Invention sample 58 | 10 | 25 | 0.50 | 1.50 | 3 | 3.00 |
| Invention sample 59 | 25 | 10 | 0.50 | 1.50 | 3 | 3.00 |

TABLE 10-continued

| | | | | | | |
|---|---|---|---|---|---|---|
| Invention sample 60 | 10 | 25 | 0.50 | 4.50 | 9 | 9.00 |
| Invention sample 61 | 10 | 5 | 0.10 | 4.50 | 45 | 9.90 |
| Invention sample 62 | 50 | 15 | 1.50 | 3.00 | 2 | 6.00 |
| Invention sample 63 | 10 | 75 | 1.50 | 3.00 | 2 | 6.00 |
| Invention sample 64 | 10 | 75 | 1.50 | 3.00 | 2 | 6.00 |
| Invention sample 65 | 10 | 75 | 1.50 | 3.00 | 2 | 6.00 |

TABLE 11

| | Second alternately laminated structure Composition | | | | |
|---|---|---|---|---|---|
| | A layer, $(Al_aCr_bTi_{1-a-b})N$ | | | C layer, $(Al_eTi_{1-e})N$ | |
| Type | a | b | 1 − a − b | e | 1 − e |
| A | 0.65 | 0.11 | 0.24 | 0.50 | 0.50 |
| B | 0.65 | 0.11 | 0.24 | 0.64 | 0.36 |
| C | 0.65 | 0.11 | 0.24 | 0.30 | 0.70 |
| D | 0.68 | 0.02 | 0.30 | 0.60 | 0.40 |
| E | 0.50 | 0.10 | 0.40 | 0.30 | 0.70 |
| F | 0.60 | 0.02 | 0.38 | 0.50 | 0.50 |
| G | 0.60 | 0.29 | 0.11 | 0.64 | 0.36 |

TABLE 12

| | A layer | | | | C layer | | | |
|---|---|---|---|---|---|---|---|---|
| Type | Temperature (° C.) | Voltage (V) | Current (A) | Pressure (Pa) | Temperature (° C.) | Voltage (V) | Current (A) | Pressure (Pa) |
| A | 500 | −80 | 80 | 3.0 | 500 | −80 | 120 | 3.0 |
| B | 500 | −80 | 80 | 3.0 | 500 | −80 | 120 | 3.0 |
| C | 500 | −80 | 80 | 3.0 | 500 | −80 | 120 | 3.0 |
| D | 500 | −80 | 80 | 3.0 | 500 | −80 | 120 | 3.0 |
| E | 500 | −80 | 80 | 3.0 | 500 | −80 | 120 | 3.0 |
| F | 500 | −80 | 80 | 3.0 | 500 | −80 | 120 | 3.0 |
| G | 500 | −80 | 80 | 3.0 | 500 | −80 | 120 | 3.0 |

TABLE 13

| Sample No. | Alternately laminated structure I(111)/I(200) |
|---|---|
| Invention sample 38 | 3.0 |
| Invention sample 39 | 2.8 |
| Invention sample 40 | 3.1 |
| Invention sample 41 | 3.0 |
| Invention sample 42 | 3.1 |
| Invention sample 43 | 2.8 |
| Invention sample 44 | 2.8 |
| Invention sample 45 | 3.0 |
| Invention sample 46 | 3.1 |
| Invention sample 47 | 3.0 |
| Invention sample 48 | 2.9 |
| Invention sample 49 | 2.9 |
| Invention sample 50 | 1.2 |
| Invention sample 51 | 4.7 |
| Invention sample 52 | 3.3 |
| Invention sample 53 | 2.9 |
| Invention sample 54 | 3.0 |

TABLE 13-continued

| Sample No. | Alternately laminated structure I(111)/I(200) |
|---|---|
| Invention sample 55 | 3.1 |
| Invention sample 56 | 2.9 |
| Invention sample 57 | 3.3 |
| Invention sample 58 | 3.1 |
| Invention sample 59 | 3.2 |
| Invention sample 60 | 3.1 |
| Invention sample 61 | 3.0 |
| Invention sample 62 | 3.2 |
| Invention sample 63 | 2.9 |
| Invention sample 64 | 3.0 |
| Invention sample 65 | 2.8 |

By using the obtained samples, the cutting test was performed in the same manner as in Example 1, and the invention samples were evaluated. The results are shown in Table 14.

TABLE 14

| | Cutting test conditions 1 | | | Cutting test conditions 2 | |
|---|---|---|---|---|---|
| Sample No. | Damage | Tool life (min) | Evaluation | Tool life (min) | Evaluation |
| Invention sample 38 | Normal wear | 34.2 | A | 28.2 | A |
| Invention sample 39 | Normal wear | 35.5 | A | 28.1 | A |
| Invention sample 40 | Normal wear | 33.7 | A | 28.6 | A |
| Invention sample 41 | Normal wear | 34.1 | A | 27.1 | A |
| Invention sample 42 | Normal wear | 34.0 | A | 27.5 | A |
| Invention sample 43 | Normal wear | 34.4 | A | 29.6 | A |
| Invention sample 44 | Normal wear | 34.6 | A | 30.2 | A |
| Invention sample 45 | Normal wear | 33.9 | A | 32.1 | A |
| Invention sample 46 | Normal wear | 35.1 | A | 32.3 | A |
| Invention sample 47 | Normal wear | 33.2 | A | 33.0 | A |
| Invention sample 48 | Normal wear | 34.0 | A | 33.3 | A |
| Invention sample 49 | Normal wear | 34.5 | A | 31.8 | A |
| Invention sample 50 | Normal wear | 31.5 | A | 30.1 | A |
| Invention sample 51 | Normal wear | 32.0 | A | 29.4 | A |
| Invention sample 52 | Normal wear | 32.1 | A | 26.5 | A |
| Invention sample 53 | Normal wear | 27.3 | B | 26.8 | A |
| Invention sample 54 | Normal wear | 35.1 | A | 34.8 | A |
| Invention sample 55 | Normal wear | 33.8 | A | 27.1 | A |
| Invention sample 56 | Normal wear | 33.9 | A | 30.1 | A |
| Invention sample 57 | Normal wear | 30.2 | A | 31.4 | A |
| Invention sample 58 | Normal wear | 35.9 | A | 25.8 | A |
| Invention sample 59 | Normal wear | 30.9 | A | 38.0 | A |
| Invention sample 60 | Normal wear | 38.5 | A | 26.8 | A |
| Invention sample 61 | Normal wear | 37.8 | A | 28.2 | A |
| Invention sample 62 | Normal wear | 34.8 | A | 28.8 | A |
| Invention sample 63 | Normal wear | 34.5 | A | 29.0 | A |
| Invention sample 64 | Normal wear | 36.3 | A | 33.5 | A |
| Invention sample 65 | Normal wear | 35.3 | A | 32.7 | A |

It was found from the results shown in Table 14 that the invention samples including the second alternately laminated structure had more excellent fracture resistance and wear resistance, and a further long tool life.

Example 3

As a substrate, a cemented carbide having a composition of 86.0% WC-12.0% Co-1.0% NbC-1.0% $Cr_3C_2$ (mass %) processed into an insert shape of SNMU1307ANEN-MJ (manufactured by Tungaloy Corporation). A predetermined metal evaporation source was arranged in the reaction vessel of the arc ion plating device. The prepared substrate was fixed to a fixing bracket of a rotary table in the reaction vessel.

After that, the inside of the reaction vessel was evacuated until the pressure reached a vacuum of $5.0\times10^{-3}$ Pa or less. After evacuation, the substrate was heated to 450° C. with a heater in the reaction vessel. After heating, Ar gas was introduced into the reaction vessel so that the pressure became 2.7 Pa.

In the Ar gas atmosphere with a pressure of 2.7 Pa, a bias voltage of −400 V was applied to the substrate, a current of 40 A was passed through the tungsten filament in the reaction vessel, and the surface of the substrate was subjected to ion bombardment treatment with Ar gas for 30 min. After the ion bombardment treatment was completed, the inside of the reaction vessel was evacuated until the pressure reached a vacuum of $5.0\times10^{-3}$ Pa or less.

For the invention samples 66 to 72, after vacuuming, the substrate was controlled until the temperature thereof became such as shown in Table 16 (the temperature at the start of film formation), $N_2$ gas was introduced into the reaction vessel, and the pressure inside the reaction vessel was adjusted to that shown in Table 16. Then, the bias voltage shown in Table 16 was applied to the substrate to evaporate the metal evaporation source having the composition of the lower layer shown in Table 15 by the arc discharge of the arc current shown in Table 16 to form a lower layer having the average thickness shown in Table 15 on the surface of the substrate.

Then, the alternately laminated structure was formed on the surface of the lower layer for the invention samples 66 to 72 and 76, as shown in Table 15. Specifically, the first alternately laminated structure having the average thickness shown in Table 15 was formed on the surface of the lower layer under the same conditions as the invention sample 1 for the invention sample 66, the invention sample 18 for the invention sample 67, the invention sample 19 for the invention sample 68, the invention sample 6 for the invention sample 69, the invention sample 3 for the invention sample 70, and the third alternately laminated structure having the average thickness shown in Table 15 was formed on the surface of the lower layer under the same conditions as the invention sample 64 for the invention samples 71 to 72. The third alternately laminated structure having the average thickness shown in Table 15 was formed on the surface of the lower layer under the same conditions as the invention sample 51 for the invention sample 76.

Further, the alternately laminated structure was formed on the surface of the substrate for the invention samples 73 to 75, as shown in Table 15. Specifically, the third alternately laminated structure having the average thickness shown in Table 15 was formed on the surface of the substrate under the same conditions as the invention sample 64 for the invention sample 73. Further, the alternately laminated structure having the average thickness shown in Table 15 was formed on the surface of the substrate under the same conditions as the invention sample 38 for the invention samples 74 to 75.

Then, for the invention samples 67 to 68 and 72 to 76, after vacuuming, the substrate was controlled until the temperature thereof became such as shown in Table 16 (the temperature at the start of film formation), $N_2$ gas was introduced into the reaction vessel, and the pressure inside the reaction vessel was adjusted to that shown in Table 16. Then, the bias voltage shown in Table 16 was applied to the substrate to evaporate the metal evaporation source having the composition of the upper layer shown in Table 15 by the arc discharge of the arc current shown in Table 16 to form an upper layer on the surface of the alternately laminated structure.

After forming the predetermined coating layer shown in Table 15 on the surface of the substrate, the power of the heater was turned off, and after the sample temperature became 100° C. or lower, the sample was taken out from the reaction vessel.

The average thickness and composition of each layer of the obtained samples were measured and calculated in the same manner as in Example 1. The results are shown in Tables 1, 9, 10, 11, and 15. Further, the ratio (I(111)/I(200)) of the diffraction peak intensity (I(111)) of the cubic crystal (111) plane to the diffraction peak intensity (I(200)) of the cubic crystal (200) plane in the alternately laminated structure of the obtained samples was measured and calculated in the same manner as in Example 1. The results are shown in Table 17. In the present Example, when the coating layer is composed of the first alternately laminated structure, the peak intensities of the cubic crystal (200) plane and the cubic crystal (111) plane of the first alternately laminated structure were measured, and when the coating layer is the third alternately laminated structure including both first alternately laminated structure and second alternately laminated structure, the peak intensities of the cubic crystal (200) plane and the cubic crystal (111) plane of the third alternately laminated structure were measured. Since the peak of the first alternately laminated structure and the peak of the second alternately laminated structure were overlapped, the peaks were not separated, and the peak intensity including both reflections was obtained. In the measurement, the peaks of the alternately laminated structure were specified by the following methods (i) to (iii).

(i) When the coating layer includes the upper layer, the peaks of the alternately laminated structure were specified by removing the upper layer by buffing.

(ii) When the coating layer includes the lower layer, the peaks of the alternately laminated structure were specified by a thin-film X-ray diffraction method so as not to be affected by the lower layer.

(iii) When the coating layer includes the upper layer and the lower layer, the peaks of the alternately laminated structure were specified by combining the above (i) and (ii).

TABLE 15

| Sample No. | Coating layer: Lower layer: Composition | Lower layer: Average thickness (μm) | Alternately laminated structure: First alternately laminated structure | Alternately laminated structure: Third alternately laminated structure etc. | Upper layer: Composition | Upper layer: Average thickness (μm) | Average thickness of entire coating layer (μm) |
|---|---|---|---|---|---|---|---|
| Invention sample 66 | $Ti_{0.90}Mo_{0.10}N$ | 0.50 | Same as Invention sample 1, Average thickness 3.00 | — | — | — | 3.50 |
| Invention sample 67 | CrN | 0.02 | Same as Invention sample 18, Average thickness 3.00 | — | $Ti_{0.80}Si_{0.20}N$ | 0.20 | 3.22 |
| Invention sample 68 | $Ti_{0.10}Al_{0.20}Cr_{0.70}N$ | 0.10 | Same as Invention sample 19, Average thickness 3.00 | — | $Ti_{0.80}Al_{0.20}N$ | 2.00 | 5.10 |
| Invention sample 69 | $Ti_{0.80}Al_{0.20}N$ | 0.20 | Same as Invention sample 6, Average thickness 1.20 | — | — | — | 1.40 |
| Invention sample 70 | TiN | 2.00 | Same as Invention sample 3, Average thickness 7.80 | — | — | — | 9.80 |
| Invention sample 71 | $TiC_{0.05}N_{0.95}$ | 0.50 | — | Same as Invention sample 64, Average thickness 6.00 | — | — | 6.50 |
| Invention sample 72 | $Al_{0.75}Cr_{0.25}N$ | 1.00 | — | Same as Invention sample 64, Average thickness 6.00 | TiN | 0.10 | 7.10 |
| Invention sample 73 | — | — | — | Same as Invention sample 64, Average thickness 6.00 | $Ti_{0.80}Si_{0.20}N$ | 0.50 | 6.50 |
| Invention sample 74 | — | — | — | Same as Invention sample 38, Average thickness 3.00 | $Ti_{0.90}Mo_{0.10}N$ | 0.20 | 3.20 |
| Invention sample 75 | — | — | — | Same as Invention sample 38, Average thickness 3.00 | NbN | 1.00 | 4.00 |
| Invention sample 76 | $Ti_{0.60}Al_{0.40}N$ | 0.30 | — | Same as Invention sample 51, Average thickness 1.20 | $Ti_{0.45}Al_{0.45}B_{0.10}N$ | 1.50 | 3.00 |

TABLE 16

| Sample No. | Lower layer: Temperature (° C.) | Lower layer: Voltage (V) | Lower layer: Current (A) | Lower layer: Pressure (Pa) | Upper layer: Temperature (° C.) | Upper layer: Voltage (V) | Upper layer: Current (A) | Upper layer: Pressure (Pa) |
|---|---|---|---|---|---|---|---|---|
| Invention sample 66 | 500 | −40 | 120 | 3.0 | — | — | — | — |
| Invention sample 67 | 500 | −80 | 80 | 3.0 | 500 | −40 | 120 | 3.0 |
| Invention sample 68 | 400 | −30 | 80 | 5.0 | 500 | −80 | 120 | 3.0 |
| Invention sample 69 | 500 | −60 | 120 | 3.0 | — | — | — | — |
| Invention sample 70 | 400 | −40 | 150 | 4.0 | — | — | — | — |
| Invention sample 71 | 500 | −80 | 80 | 3.0 | — | — | — | — |
| Invention sample 72 | 300 | −120 | 120 | 5.0 | 500 | −40 | 120 | 5.0 |
| Invention sample 73 | — | — | — | — | 500 | −30 | 120 | 3.0 |
| Invention sample 74 | — | — | — | — | 500 | −40 | 120 | 3.0 |
| Invention sample 75 | — | — | — | — | 500 | −80 | 150 | 3.0 |
| Invention sample 76 | 500 | −80 | 80 | 3 | 500 | −40 | 120 | 5.0 |

TABLE 17

| Sample No. | Alternately laminated structure I(111)/I(200) |
|---|---|
| Invention sample 66 | 2.8 |
| Invention sample 67 | 3.2 |
| Invention sample 68 | 2.9 |
| Invention sample 69 | 3.1 |
| Invention sample 70 | 2.6 |
| Invention sample 71 | 3.0 |
| Invention sample 72 | 3.4 |
| Invention sample 73 | 3.1 |
| Invention sample 74 | 3.0 |
| Invention sample 75 | 3.2 |
| Invention sample 76 | 4.5 |

By using the obtained samples, the cutting test was performed in the same manner as in Example 1, and the invention samples were evaluated. The results are shown in Table 18.

TABLE 18

| | Cutting test conditions 1 | | | Cutting test conditions 2 | |
|---|---|---|---|---|---|
| Sample No. | Damage | Tool life (min) | Evaluation | Tool life (min) | Evaluation |
| Invention sample 66 | Normal wear | 32.8 | A | 27.8 | A |
| Invention sample 67 | Normal wear | 36.8 | A | 29.3 | A |
| Invention sample 68 | Normal wear | 29.8 | A | 26.6 | A |
| Invention sample 69 | Normal wear | 30.2 | A | 30.0 | A |
| Invention sample 70 | Normal wear | 38.2 | A | 25.6 | A |
| Invention sample 71 | Normal wear | 36.8 | A | 34.2 | A |
| Invention sample 72 | Normal wear | 37.9 | A | 36.3 | A |
| Invention sample 73 | Normal wear | 39.9 | A | 33.8 | A |
| Invention sample 74 | Normal wear | 35.7 | A | 29.2 | A |
| Invention sample 75 | Normal wear | 37.2 | A | 28.5 | A |
| Invention sample 76 | Normal wear | 35.6 | A | 30.3 | A |

It was found from the results shown in Table 18 that the invention samples including the lower layer and/or the upper layer had more excellent fracture resistance and wear resistance, and a further long tool life.

INDUSTRIAL APPLICABILITY

Since the coated cutting tool of the invention has excellent wear resistance and fracture resistance, the tool life can be extended as compared with that in the related art. Therefore, the coated cutting tool has high industrial applicability in this respect.

REFERENCE SIGNS LIST

1: Coated cutting tool, 2: Substrate, 3: Coating layer, 4: First alternately laminated structure, 41: A layer, 42: B layer, 5: Second alternately laminated structure, 51: A layer, 52: C layer, 6: Third alternately laminated structure.

What is claimed is:

1. A coated cutting tool comprising a substrate and a coating layer formed on the substrate, wherein the coating layer has a first alternately laminated structure in which two or more A layers and two or more B layers are alternately formed;

the A layer contains a compound having a composition represented by a following formula (1):

$$(Al_aCr_bTi_{1-a-b})N \quad (1)$$

in the formula (1), a is an atomic ratio content of an Al element to a total of the Al element, a Cr element, and a Ti element, and satisfies $0.50 \leq a \leq 0.68$;

b is an atomic ratio content of the Cr element to the total of the Al element, the Cr element, and the Ti element, and satisfies $0.02 \leq b \leq 0.30$; and $1-a-b$ is an atomic ratio content of the Ti element to the total of the Al element, the Cr element, and the Ti element, and satisfies $0.11 \leq 1-a-b \leq 0.40$;

the B layer contains a compound having a composition represented by a following formula (2):

$$(Al_cTi_{1-c-d}B_d)N \quad (2)$$

in the formula (2), c is an atomic ratio content of the Al element to a total of the Al element, the Ti element, and a B element, and satisfies $0.30 \leq c \leq 0.64$;

d is an atomic ratio content of the B element to the total of the Al element, the Ti element, and the B element, and satisfies $0.01 \leq d \leq 0.10$; and 1−c−d is an atomic ratio content of the Ti element to the total of the Al element, the Ti element, and the B element, and satisfies $0.30 \leq 1 \leq c-d \leq 0.69$;

an average thickness of the first alternately laminated structure is 0.50 μm or more and 10.00 μm or less;

an average thickness per layer of the A layer in the first alternately laminated structure is 2 nm or more and 300 nm or less; and an average thickness per layer of the B layer in the first alternately laminated structure is 2 nm or more and 300 nm or less.

2. The coated cutting tool according to claim 1, wherein a ratio ((1−a−b)/d) of the atomic ratio content of the Ti element in the A layer to the atomic ratio content of the B element in the B layer is 2.0 or more and 25.0 or less.

3. The coated cutting tool according to claim 2, wherein an average value ((a+c)/2) of the atomic ratio content of the Al element in the A layer and the atomic ratio content of the Al element in the B layer is 0.50 or more and 0.62 or less.

4. The coated cutting tool according to claim 2, wherein the coating layer further has a second alternately laminated structure in which two or more A layers and two or more C layers are alternately formed;

the C layer contains a compound having a composition represented by a following formula (3):

$$(Al_eTi_{1-e})N \quad (3)$$

in the formula (3), e is an atomic ratio content of the Al element to a total of the Al element and the Ti element, and satisfies $0.30 \leq e \leq 0.64$;

1−e is an atomic ratio content of the Ti element to the total of the Al element and the Ti element, and satisfies $0.36 \leq 1-e \leq 0.70$;

an average thickness of the second alternately laminated structure is 0.50 μm or more and 5.00 μm or less;

an average thickness per layer of the A layer in the second alternately laminated structure is 2 nm or more and less than 30 nm; and an average thickness per layer of the C layer in the second alternately laminated structure is 2 nm or more and less than 30 nm.

5. The coated cutting tool according to claim 2, wherein the average thickness per layer of the A layer in the first alternately laminated structure is 30 nm or more and 300 nm or less; and the average thickness per layer of the B layer in the first alternately laminated structure is 30 nm or more and 300 nm or less.

6. The coated cutting tool according to claim 2, wherein a ratio (I(111)/I(200)) of a diffraction peak intensity (I(111)) of a cubic crystal (111) plane to a diffraction peak intensity (I(200)) of a cubic crystal (200) plane is 0.5 or more and 5.0 or less in X-ray diffraction of the first alternately laminated structure.

7. The coated cutting tool according to claim 2, wherein an average thickness of the entire coating layer is 0.5 μm or more and 10.0 μm or less.

8. The coated cutting tool according to claim 1, wherein an average value ((a+c)/2) of the atomic ratio content of the Al element in the A layer and the atomic ratio content of the Al element in the B layer is 0.50 or more and 0.62 or less.

9. The coated cutting tool according to claim 8, wherein the coating layer further has a second alternately laminated structure in which two or more A layers and two or more C layers are alternately formed;

the C layer contains a compound having a composition represented by a following formula (3):

$$(Al_eTi_{1-e})N \quad (3)$$

in the formula (3), e is an atomic ratio content of the Al element to a total of the Al element and the Ti element, and satisfies $0.30 \leq e \leq 0.64$;

1−e is an atomic ratio content of the Ti element to the total of the Al element and the Ti element, and satisfies $0.36 \leq 1-e \leq 0.70$;

an average thickness of the second alternately laminated structure is 0.50 μm or more and 5.00 μm or less;

an average thickness per layer of the A layer in the second alternately laminated structure is 2 nm or more and less than 30 nm; and an average thickness per layer of the C layer in the second alternately laminated structure is 2 nm or more and less than 30 nm.

10. The coated cutting tool according to claim 8, wherein the average thickness per layer of the A layer in the first alternately laminated structure is 30 nm or more and 300 nm or less; and the average thickness per layer of the B layer in the first alternately laminated structure is 30 nm or more and 300 nm or less.

11. The coated cutting tool according to claim 1, wherein the coating layer further has a second alternately laminated structure in which two or more A layers and two or more C layers are alternately formed;

the C layer contains a compound having a composition represented by a following formula (3):

$$(Al_eTi_{1-e})N \quad (3)$$

in the formula (3), e is an atomic ratio content of the Al element to a total of the Al element and the Ti element, and satisfies $0.30 \leq e \leq 0.64$;

1−e is an atomic ratio content of the Ti element to the total of the Al element and the Ti element, and satisfies $0.36 \leq 1-e \leq 0.70$;

an average thickness of the second alternately laminated structure is 0.50 μm or more and 5.00 μm or less;

an average thickness per layer of the A layer in the second alternately laminated structure is 2 nm or more and less than 30 nm; and an average thickness per layer of the C layer in the second alternately laminated structure is 2 nm or more and less than 30 nm.

12. The coated cutting tool according to claim 11, wherein the coating layer has a third alternately laminated structure in which the first alternately laminated structure and the second alternately laminated structure are alternately formed three or more times in total;

an average thickness per structure of the first alternately laminated structure in the third alternately laminated structure is 0.1 μm or more and 1.5 μm or less; and an average thickness per structure of the second alternately laminated structure in the third alternately laminated structure is 0.1 μm or more and 1.5 μm or less.

13. The coated cutting tool according to claim 12, wherein a ratio (I(111)/I(200)) of a diffraction peak intensity (I(111)) of a cubic crystal (111) plane to a diffraction peak intensity (I(200)) of a cubic crystal (200) plane is 0.5 or more and 5.0 or less in X-ray diffraction of the third alternately laminated structure.

14. The coated cutting tool according to claim 12, wherein the coating layer has an upper layer on a surface opposite to the substrate in the first alternately laminated structure or the third alternately laminated structure;

the upper layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B, provided that, a composition of the compound constituting the upper layer is different from a composition of the compound constituting the first alternately laminated structure or the second alternately laminated structure being in contact with the upper layer; and an average thickness of the upper layer is 0.01 μm or more and 2.00 μm or less.

15. The coated cutting tool according to claim 12, wherein the coating layer has a lower layer between the substrate and the first alternately laminated structure or the third alternately laminated structure;

the lower layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B, (provided that, a composition of the compound constituting the lower layer is different from a composition of the compound constituting the first alternately laminated structure or the second alternately laminated structure being in contact with the lower layer; and an average thickness of the lower layer is 0.01 μm or more and 2.00 μm or less.

16. The coated cutting tool according to claim 1, wherein the average thickness per layer of the A layer in the first alternately laminated structure is 30 nm or more and 300 nm or less; and the average thickness per layer of the B layer in the first alternately laminated structure is 30 nm or more and 300 nm or less.

17. The coated cutting tool according to claim 1, wherein a ratio (I(111)/I(200)) of a diffraction peak intensity (I(111)) of a cubic crystal (111) plane to a diffraction peak intensity (I(200)) of a cubic crystal (200) plane is 0.5 or more and 5.0 or less in X-ray diffraction of the first alternately laminated structure.

18. The coated cutting tool according to claim 1, wherein the coating layer has an upper layer on a surface opposite to the substrate in the first alternately laminated structure or a third alternately laminated structure in which the first alternately laminated structure and the second alternately laminated structure are alternately formed three or more times in total;

the upper layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B, provided that, a composition of the compound constituting the upper layer is different from a composition of the compound constituting the first alternately laminated structure or the second alternately laminated structure being in contact with the upper layer; and an average thickness of the upper layer is 0.01 μm or more and 2.00 μm or less.

19. The coated cutting tool according to claim 1, wherein the coating layer has a lower layer between the substrate and the first alternately laminated structure or a third alternately laminated structure in which the first alternately laminated structure and the second alternately laminated structure are alternately formed three or more times in total;

the lower layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B, (provided that, a composition of the compound constituting the lower layer is different from a composition of the compound constituting the first alternately laminated structure or the second alternately laminated structure being in contact with the lower layer; and an average thickness of the lower layer is 0.01 μm or more and 2.00 μm or less.

20. The coated cutting tool according to claim 1, wherein an average thickness of the entire coating layer is 0.5 μm or more and 10.0 μm or less.

* * * * *